US007564734B2

(12) United States Patent
Kumagai et al.

(10) Patent No.: US 7,564,734 B2
(45) **Date of Patent: *Jul. 21, 2009**

(54) INTEGRATED CIRCUIT DEVICE AND ELECTRONIC INSTRUMENT

(75) Inventors: Takashi Kumagai, Chino (JP); Hisanobu Ishiyama, Chino (JP); Kazuhiro Maekawa, Chino (JP); Satoru Ito, Suwa (JP); Takashi Fujise, Shiojiri (JP); Junichi Karasawa, Tatsuno-machi (JP); Satoru Kodaira, Chino (JP)

(73) Assignee: Seiko Epson Corporation, Tokyo (JP)

( * ) Notice: Subject to any disclaimer, the term of this patent is extended or adjusted under 35 U.S.C. 154(b) by 728 days.

This patent is subject to a terminal disclaimer.

(21) Appl. No.: 11/270,585

(22) Filed: Nov. 10, 2005

(65) Prior Publication Data

US 2007/0001971 A1 Jan. 4, 2007

(30) Foreign Application Priority Data

Jun. 30, 2005 (JP) ............................. 2005-191708

(51) Int. Cl.
*G11C 8/00* (2006.01)

(52) U.S. Cl. ............................ 365/230.03; 365/189.08; 365/230.06

(58) Field of Classification Search ............ 365/230.03, 365/230.06, 63, 189.08
See application file for complete search history.

(56) References Cited

U.S. PATENT DOCUMENTS

| | | | |
|---|---|---|---|
| 4,472,638 | A | 9/1984 | Nishizawa et al. |
| 4,566,038 | A | 1/1986 | Dimick |
| 4,648,077 | A | 3/1987 | Pinkham et al. |
| 4,975,753 | A | 12/1990 | Ema |
| 5,040,152 | A | 8/1991 | Voss et al. |
| 5,058,058 | A | 10/1991 | Yasuda et al. |
| 5,233,420 | A | 8/1993 | Piri et al. |
| 5,325,338 | A | 6/1994 | Runaldue et al. |
| 5,426,603 | A | 6/1995 | Nakamura et al. |
| 5,490,114 | A | 2/1996 | Butler et al. |
| 5,544,306 | A | 8/1996 | Deering et al. |
| 5,598,346 | A | 1/1997 | Agrawal et al. |

(Continued)

FOREIGN PATENT DOCUMENTS

| | | |
|---|---|---|
| CN | 1534560 | 10/2004 |

(Continued)

OTHER PUBLICATIONS

U.S. Appl. No. 12/000,882, filed Dec. 18, 2007 in the name of Kodaira et al.

*Primary Examiner*—Tuan T Nguyen
*Assistant Examiner*—Hien N Nguyen
(74) *Attorney, Agent, or Firm*—Oliff & Berridge, PLC

(57) ABSTRACT

An integrated circuit device includes first to Nth circuit blocks CB1 to CBN disposed along a direction D1, a first interface region provided on the D2 side of the circuit blocks CB1 to CBN, and a second interface region provided on the D4 side of the circuit blocks CB1 to CBN. The circuit blocks CB1 to CBN include a data driver block DB and a circuit block other than the data driver block DB. When the widths of the first interface region, the circuit blocks CB1 to CBN, and the second interface region in the direction D2 are respectively W1, WB, and W2, the integrated circuit device has a width W in the direction D2 of "W1+WB+W2≦W<W1+2×WB+W2".

20 Claims, 23 Drawing Sheets

U.S. PATENT DOCUMENTS

| | | | |
|---|---|---|---|
| 5,659,514 | A | 8/1997 | Hazani |
| 5,701,269 | A | 12/1997 | Fujii |
| 5,739,803 | A | 4/1998 | Neugebauer |
| 5,767,865 | A | 6/1998 | Inoue et al. |
| 5,815,136 | A | 9/1998 | Ikeda et al. |
| 5,860,084 | A | 1/1999 | Yaguchi |
| RE36,089 | E | 2/1999 | Ooishi et al. |
| 5,909,125 | A | 6/1999 | Kean |
| 5,917,770 | A | 6/1999 | Tanaka |
| 5,920,885 | A | 7/1999 | Rao |
| 5,933,364 | A | 8/1999 | Aoyama et al. |
| 6,005,296 | A | 12/1999 | Chan |
| 6,025,822 | A | 2/2000 | Motegi et al. |
| 6,034,541 | A | 3/2000 | Kopec, Jr. et al. |
| 6,111,786 | A | 8/2000 | Nakamura |
| 6,118,425 | A | 9/2000 | Kudo et al. |
| 6,140,983 | A | 10/2000 | Quanrud |
| 6,225,990 | B1 | 5/2001 | Aoki et al. |
| 6,229,336 | B1 | 5/2001 | Felton et al. |
| 6,229,753 | B1 | 5/2001 | Kono et al. |
| 6,246,386 | B1 | 6/2001 | Perner |
| 6,259,459 | B1 | 7/2001 | Middleton |
| 6,278,148 | B1 | 8/2001 | Watanabe et al. |
| 6,324,088 | B1 | 11/2001 | Keeth et al. |
| 6,339,417 | B1 | 1/2002 | Quanrud |
| 6,421,286 | B1 | 7/2002 | Ohtani et al. |
| 6,559,508 | B1 | 5/2003 | Lin et al. |
| 6,580,631 | B1 | 6/2003 | Keeth et al. |
| 6,611,407 | B1 | 8/2003 | Chang |
| 6,646,283 | B1 | 11/2003 | Akimoto et al. |
| 6,724,378 | B2 | 4/2004 | Tamura et al. |
| 6,731,538 | B2 | 5/2004 | Noda et al. |
| 6,822,631 | B1 | 11/2004 | Yatabe |
| 6,826,116 | B2 | 11/2004 | Noda et al. |
| 6,862,247 | B2 | 3/2005 | Yamazaki |
| 6,873,310 | B2 | 3/2005 | Matsueda |
| 6,873,566 | B2 | 3/2005 | Choi |
| 6,999,353 | B2 | 2/2006 | Noda et al. |
| 7,078,948 | B2 | 7/2006 | Dosho |
| 7,081,879 | B2 | 7/2006 | Sun et al. |
| 7,142,221 | B2 | 11/2006 | Sakamaki et al. |
| 7,158,439 | B2 | 1/2007 | Shionori et al. |
| 7,164,415 | B2 | 1/2007 | Ooishi et al. |
| 7,176,864 | B2 | 2/2007 | Moriyama et al. |
| 7,180,495 | B1 | 2/2007 | Matsueda |
| 7,280,329 | B2 | 10/2007 | Kim et al. |
| 7,330,163 | B2 | 2/2008 | Nakai et al. |
| 7,388,803 | B2 | 6/2008 | Kodaira et al. |
| 7,391,668 | B2 * | 6/2008 | Natori et al. ........... 365/230.03 |
| 7,411,804 | B2 * | 8/2008 | Kumagai et al. .............. 365/63 |
| 7,411,861 | B2 | 8/2008 | Kodaira et al. |
| 7,471,573 | B2 | 12/2008 | Kodaira et al. |
| 7,492,659 | B2 | 2/2009 | Kodaira et al. |
| 7,495,988 | B2 * | 2/2009 | Kodaira et al. .............. 365/226 |
| 7,522,441 | B2 * | 4/2009 | Kumagai et al. .............. 365/63 |
| 2001/0022744 | A1 | 9/2001 | Noda et al. |
| 2002/0011998 | A1 | 1/2002 | Tamura |
| 2002/0018058 | A1 | 2/2002 | Tamura |
| 2002/0113783 | A1 | 8/2002 | Tamura et al. |
| 2002/0126108 | A1 | 9/2002 | Koyama et al. |
| 2002/0154557 | A1 | 10/2002 | Mizugaki et al. |
| 2003/0034948 | A1 | 2/2003 | Imamura |
| 2003/0053022 | A1 | 3/2003 | Kaneko et al. |
| 2003/0053321 | A1 | 3/2003 | Ishiyama |
| 2003/0169244 | A1 | 9/2003 | Kurokawa et al. |
| 2004/0004877 | A1 | 1/2004 | Uetake |
| 2004/0017341 | A1 | 1/2004 | Maki |
| 2004/0021947 | A1 | 2/2004 | Schofield et al. |
| 2004/0124472 | A1 | 7/2004 | Lin et al. |
| 2004/0140970 | A1 | 7/2004 | Morita |
| 2004/0239606 | A1 | 12/2004 | Ota |
| 2005/0001846 | A1 | 1/2005 | Shiono |
| 2005/0045955 | A1 | 3/2005 | Kim et al. |
| 2005/0047266 | A1 | 3/2005 | Shionori et al. |
| 2005/0052340 | A1 | 3/2005 | Goto et al. |
| 2005/0057581 | A1 | 3/2005 | Horiuchi et al. |
| 2005/0073470 | A1 | 4/2005 | Nose et al. |
| 2005/0122303 | A1 | 6/2005 | Hashimoto |
| 2005/0195149 | A1 | 9/2005 | Ito |
| 2005/0212788 | A1 | 9/2005 | Fukuda et al. |
| 2005/0212826 | A1 | 9/2005 | Fukuda et al. |
| 2005/0219189 | A1 | 10/2005 | Fukuo |
| 2005/0253976 | A1 | 11/2005 | Sekiguchi et al. |
| 2005/0262293 | A1 | 11/2005 | Yoon |
| 2005/0285862 | A1 | 12/2005 | Noda et al. |
| 2006/0028417 | A1 | 2/2006 | Harada et al. |
| 2006/0050042 | A1 | 3/2006 | Yi |
| 2006/0062483 | A1 | 3/2006 | Kondo et al. |
| 2007/0000971 | A1 | 1/2007 | Kumagai et al. |
| 2007/0001886 | A1 | 1/2007 | Ito et al. |
| 2007/0001968 | A1 | 1/2007 | Kodaira et al. |
| 2007/0001969 | A1 | 1/2007 | Kodaira et al. |
| 2007/0001970 | A1 | 1/2007 | Kodaira et al. |
| 2007/0001972 | A1 * | 1/2007 | Kumagai et al. .............. 345/98 |
| 2007/0001973 | A1 | 1/2007 | Kumagai et al. |
| 2007/0001974 | A1 | 1/2007 | Kumagai et al. |
| 2007/0001975 | A1 | 1/2007 | Kumagai et al. |
| 2007/0001982 | A1 | 1/2007 | Ito et al. |
| 2007/0001983 | A1 | 1/2007 | Ito et al. |
| 2007/0001984 | A1 | 1/2007 | Kumagai et al. |
| 2007/0002061 | A1 | 1/2007 | Kumagai et al. |
| 2007/0002062 | A1 | 1/2007 | Kodaira et al. |
| 2007/0002063 | A1 | 1/2007 | Kumagai et al. |
| 2007/0002188 | A1 | 1/2007 | Kumagai et al. |
| 2007/0002509 | A1 | 1/2007 | Kumagai et al. |
| 2007/0002667 | A1 | 1/2007 | Kodaira et al. |
| 2007/0002669 | A1 | 1/2007 | Kodaira et al. |
| 2007/0002670 | A1 | 1/2007 | Kodaira et al. |
| 2007/0002671 | A1 | 1/2007 | Kumagai et al. |
| 2007/0013074 | A1 | 1/2007 | Kodaira et al. |
| 2007/0013634 | A1 | 1/2007 | Saiki et al. |
| 2007/0013635 | A1 | 1/2007 | Ito et al. |
| 2007/0013684 | A1 | 1/2007 | Kodaira et al. |
| 2007/0013685 | A1 | 1/2007 | Kodaira et al. |
| 2007/0013687 | A1 | 1/2007 | Kodaira et al. |
| 2007/0013706 | A1 | 1/2007 | Kodaira et al. |
| 2007/0013707 | A1 | 1/2007 | Kodaira et al. |
| 2007/0016700 | A1 | 1/2007 | Kodaira et al. |
| 2007/0035503 | A1 | 2/2007 | Kurokawa et al. |
| 2007/0187762 | A1 | 8/2007 | Saiki et al. |

FOREIGN PATENT DOCUMENTS

| | | |
|---|---|---|
| CN | 1542964 | 11/2004 |
| EP | 0 499 478 A2 | 8/1992 |
| JP | A 63-225993 | 9/1988 |
| JP | A 1-171190 | 7/1989 |
| JP | A 4-370595 | 12/1992 |
| JP | A 5-181154 | 7/1993 |
| JP | A 7-281634 | 10/1995 |
| JP | A 8-69696 | 3/1996 |
| JP | A 11-261011 | 9/1999 |
| JP | A 11-274424 | 10/1999 |
| JP | A 11-330393 | 11/1999 |
| JP | A-2001-067868 | 3/2001 |
| JP | A 2001-222249 | 8/2001 |
| JP | A 2001-222276 | 8/2001 |
| JP | A 2002-244624 | 8/2002 |
| JP | A-2002-358777 | 12/2002 |
| JP | A 2003-022063 | 1/2003 |
| JP | A 2003-330433 | 11/2003 |
| JP | A 2004-040042 | 2/2004 |
| JP | A 2004-146806 | 5/2004 |
| JP | A 2004-159314 | 6/2004 |

| | | |
|---|---|---|
| JP | A 2004-328456 | 11/2004 |
| JP | A-2005-017725 | 1/2005 |
| JP | A 2005-72607 | 3/2005 |
| KR | A 1992-17106 | 9/1992 |
| KR | 1999-88197 | 12/1999 |
| KR | A 2001-100814 | 11/2001 |
| KR | 10-2005-0011743 A | 1/2005 |
| TW | 501080 | 9/2002 |
| TW | 522366 | 3/2003 |
| TW | 1224300 | 3/2003 |
| TW | 563081 | 11/2003 |

* cited by examiner

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

INTEGRATED CIRCUIT DEVICE AND ELECTRONIC INSTRUMENT

Japanese Patent Application No. 2005-191708, filed on Jun. 30, 2005, is hereby incorporated by reference in its entirety.

BACKGROUND OF THE INVENTION

The present invention relates to an integrated circuit device and an electronic instrument.

A display driver (LCD driver) is an example of an integrated circuit device which drives a display panel such as a liquid crystal panel (JP-A-2001-222249). A reduction in the chip size is required for the display driver in order to reduce cost.

However, the size of the display panel incorporated in a portable telephone or the like is almost constant. Therefore, if the chip size is reduced by merely shrinking the integrated circuit device as the display driver by using a macrofabrication technology, it becomes difficult to mount the integrated circuit device.

SUMMARY

A first aspect of the invention relates to an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side;

a first interface region provided along the fourth side and on the second direction side of the first to Nth circuit blocks; and a second interface region provided along the second side and on a fourth direction side of the first to Nth circuit blocks, the fourth direction side being opposite to the second direction, wherein the first to Nth circuit blocks includes at least one data driver block for driving data lines and a circuit block other than the data driver block, and wherein, when widths of the first interface region, the first to Nth circuit blocks, and the second interface region in the second direction are respectively W1, WB, and W2, the integrated circuit device has a width W in the second direction of "$W1+WB+W2 \leqq W < W1+2\times WB+W2$".

A second aspect of the invention relates to an electronic instrument, comprising:

the above integrated circuit device; and a display panel driven by the integrated circuit device.

BRIEF DESCRIPTION OF THE SEVERAL VIEWS OF THE DRAWING

FIG. 4 is an example of various types of display drivers and circuit blocks provided in the display drivers.

DETAILED DESCRIPTION OF THE EMBODIMENT

Figure 1A:
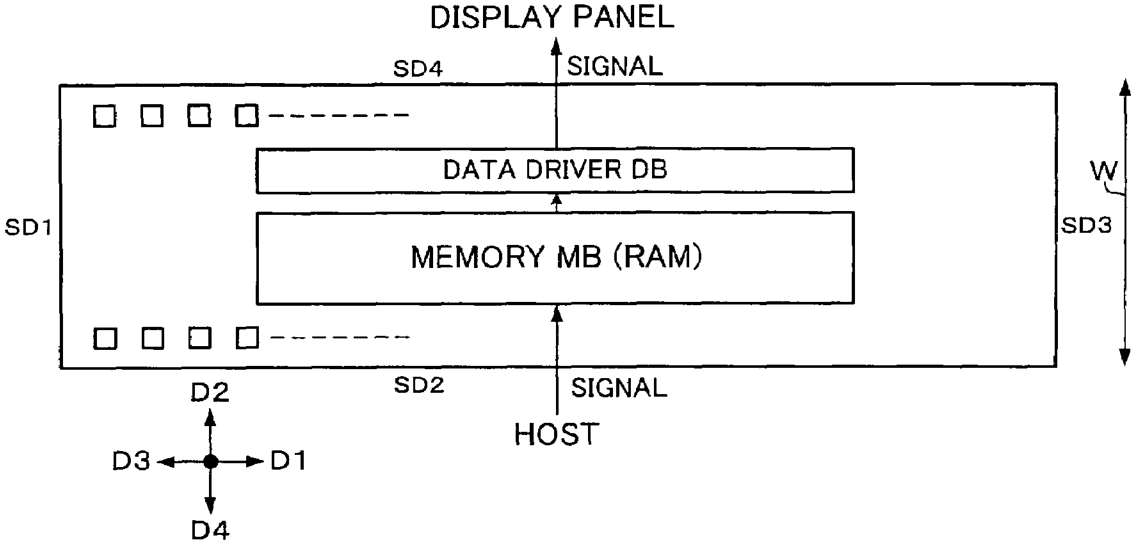
FIGS. 1A to 1C show an integrated circuit device which is a comparative example of one embodiment of the invention.

The invention may provide a slim integrated circuit device and an electronic instrument including the same.

An embodiment of the invention provides an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side;

a first interface region provided along the fourth side and on the second direction side of the first to Nth circuit blocks; and a second interface region provided along the second side and on a fourth direction side of the first to Nth circuit blocks, the fourth direction side being opposite to the second direction, wherein the first to Nth circuit blocks includes at least one data driver block for driving data lines and a circuit block other than the data driver block, and wherein, when widths of the first interface region, the first to Nth circuit blocks, and the second interface region in the second direction are respectively W1, WB, and W2, the integrated circuit device has a width W in the second direction of "W1+WB+W2≦W<W1+2×WB+W2".

In the embodiment, the integrated circuit device includes the first to Nth circuit blocks disposed along the first direction and the first and second interface regions. The first to Nth circuit blocks include the data driver block and the circuit block other than the data driver block. The widths W1, WB, and W2 of the first interface region, the first to Nth circuit blocks, and the second interface region satisfy the relationship expressed as "W1+WB+W2≦W<W1+2×WB+W2". According to the integrated circuit device in which such a relational expression is satisfied, the width in the second direction can be reduced while securing the width of the circuit block in the second direction (without causing the layout of the circuit block to become flat to a large extent), whereby a slim integrated circuit device can be provided. This enables facilitation of mounting and a reduction in cost of the device. Moreover, since the circuit block is not flat to a large extent, the layout design is facilitated, whereby the development period of the device can be reduced.

In this embodiment, the first interface region may be disposed on the second direction side of the data driver block without another circuit block interposed therebetween, and the second interface region may be disposed on the fourth direction side of the data driver block without another circuit block interposed therebetween.

This enables the width of the first to Nth circuit blocks in the second direction to be set based on the width of the data driver block in the second direction. Since only one circuit block (data driver block) exists in the second direction in the area in which at least the data driver block exists, a slim integrated circuit device can be realized without causing the layout of the data driver block to become flat to a large extent.

With this embodiment, data signal output lines of the data driver block may be disposed in the data driver block along the second direction.

This enables the data signal output lines from the data driver block to be connected with other regions.

With this embodiment, the data signal output lines of the data driver block may be disposed in the first interface region along the first direction.

This enables the data signal output lines from the data driver block to be connected with pads or the like by utilizing the first interface region.

With this embodiment, a data driver included in the data driver block may include Q driver cells arranged along the second direction, each of the driver cells outputting a data signal corresponding to image data for one pixel; and when a width of the driver cell in the second direction is WD, the first to Nth circuit blocks may have a width WB in the second direction of "Q×WD≦WB<(Q+1)×WD".

The image data signals from another circuit block disposed along the first direction can be efficiently input to the driver cells by disposing the driver cells along the second direction in this manner. The width of the integrated circuit device in the second direction can be reduced by minimizing the width of the data driver block in the second direction.

When the number of pixels of a display panel in a horizontal scan direction is HPN, the number of the data driver blocks is DBN, and the number of inputs of image data to the driver cell in one horizontal scan period is IN, the number Q of the driver cells arranged along the second direction may be "Q=HPN/(DBN×IN)".

This enables the width of the first to Nth circuit blocks in the second direction to be set at an optimum value corresponding to the number of data driver blocks and the number of inputs of image data, for example.

With this embodiment, the first to Nth circuit blocks may include at least one memory block which stores image data.

With this embodiment, the first interface region may be disposed on the second direction side of the memory block without another circuit block interposed therebetween; and the second interface region may be disposed on the fourth direction side of the memory block without another circuit block interposed therebetween.

This enables the width of the first to Nth circuit blocks to be set based on the width of the memory block. Since only one circuit block (memory block) exists in the second direction in the area in which at least the memory block exists, a slim integrated circuit device can be realized.

With this embodiment, a data driver included in the data driver block may include Q driver cells arranged along the second direction, each of the driver cells outputting a data signal corresponding to image data for one pixel; and when a width of the driver cell in the second direction is WD, and a width of a peripheral circuit section included in the memory block in the second direction is WPC, "Q×WD≦WB<(Q+1)×WD+WPC" may be satisfied.

This enables the width of the integrated circuit device in the second direction to be reduced by minimizing the width of the data driver block in the second direction.

With this embodiment, when the number of pixels of a display panel in a horizontal scan direction is HPN, the number of the data driver blocks is DBN, and the number of inputs of image data to the driver cell in one horizontal scan period is IN, the number Q of the driver cells arranged along the second direction may be "Q=HPN/(DBN×IN)".

With this embodiment, a sense amplifier block included in the memory block may include P sense amplifiers arranged along the second direction, each of the sense amplifiers outputting 1-bit image data; and when a width of the sense amplifier in the second direction is WS, the number of bits of image data for one pixel is PDB, and a width of a peripheral circuit section included in the memory block in the second direction is WPC, "P×WS≦WB<(P+PDB)×WS+WPC" may be satisfied.

This enables the width of the integrated circuit device in the second direction to be reduced by minimizing the width of the memory block in the second direction.

With this embodiment, when the number of pixels of a display panel in a horizontal scan direction is defined as HPN, the number of bits of image data for one pixel is PDB, the number of the memory blocks is MBN, and the number of readings of image data from the memory block in one horizontal scan period is RN, the number P of the sense amplifiers arranged along the second direction may be "P=(HPN×PDB)/(MBN×RN)".

This enables the width of the first to Nth circuit blocks in the second direction to be set at an optimum value corresponding to the number of memory blocks and the number of readings of image data, for example.

With this embodiment, the memory block and the data driver block may be disposed adjacent to each other along the first direction.

This enables the width of the integrated circuit device in the second direction to be reduced in comparison with the case of disposing the memory block and the data driver block along the second direction. Moreover, effects on other circuit blocks can be minimized when the configuration of the memory block or the data driver block is changed, whereby the design efficiency can be increased.

With this embodiment, image data stored in the memory block may be read from the memory block into the data driver block adjacent to the memory block a plurality of times in one horizontal scan period.

According to this feature, since the number of memory cells of the memory block in the second direction is decreased, the width of the memory block in the second direction can be reduced, whereby the width of the integrated circuit device in the second direction can be reduced.

With this embodiment, the width W of the integrated circuit device in the second direction may be "W<2×WB".

This enables the width of the integrated circuit device in the second direction to be reduced while sufficiently ensuring the width of the first to Nth circuit blocks in the second direction.

An embodiment of the invention provides an electronic instrument, comprising:

any one of the above integrated circuit devices; and a display panel driven by the integrated circuit device.

Note that the embodiments described hereunder do not in any way limit the scope of the invention defined by the claims laid out herein. Note also that not all of the elements of these embodiments should be taken as essential requirements to the means of the present invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
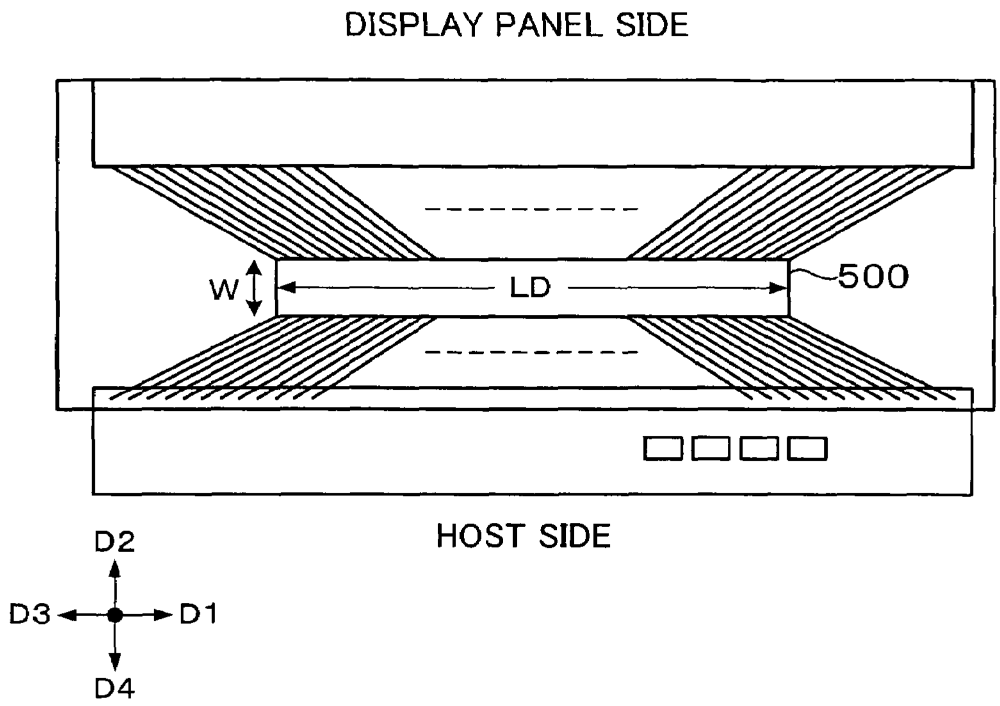
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
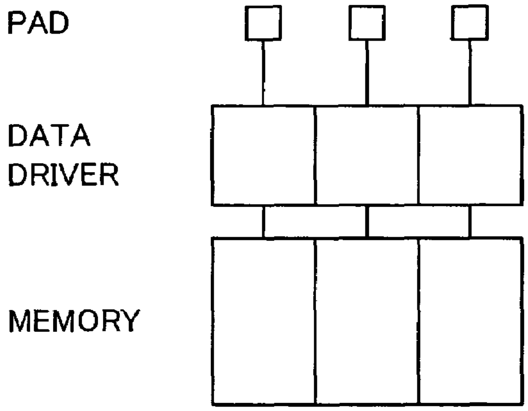
Figure 1C:
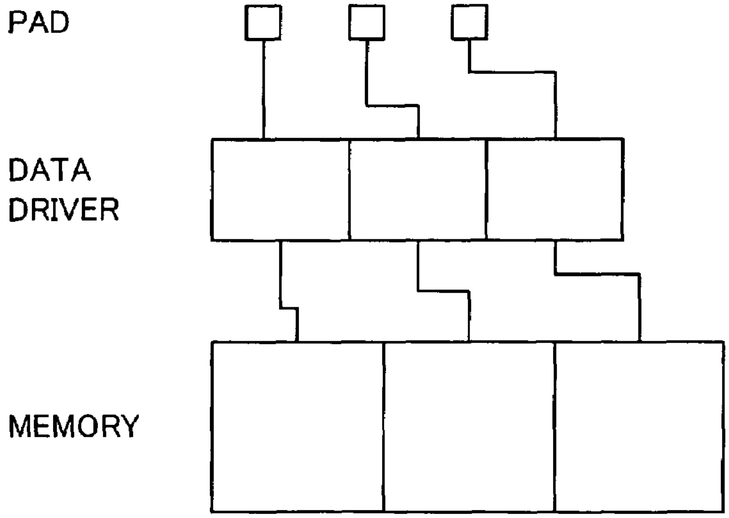

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary interconnect region for absorbing the pitch difference must be formed between the circuit blocks. In particular, in the comparative example shown in FIG. 1A in which the block is made flat in the direction D1, the area of an unnecessary interconnect region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

Figure 3:
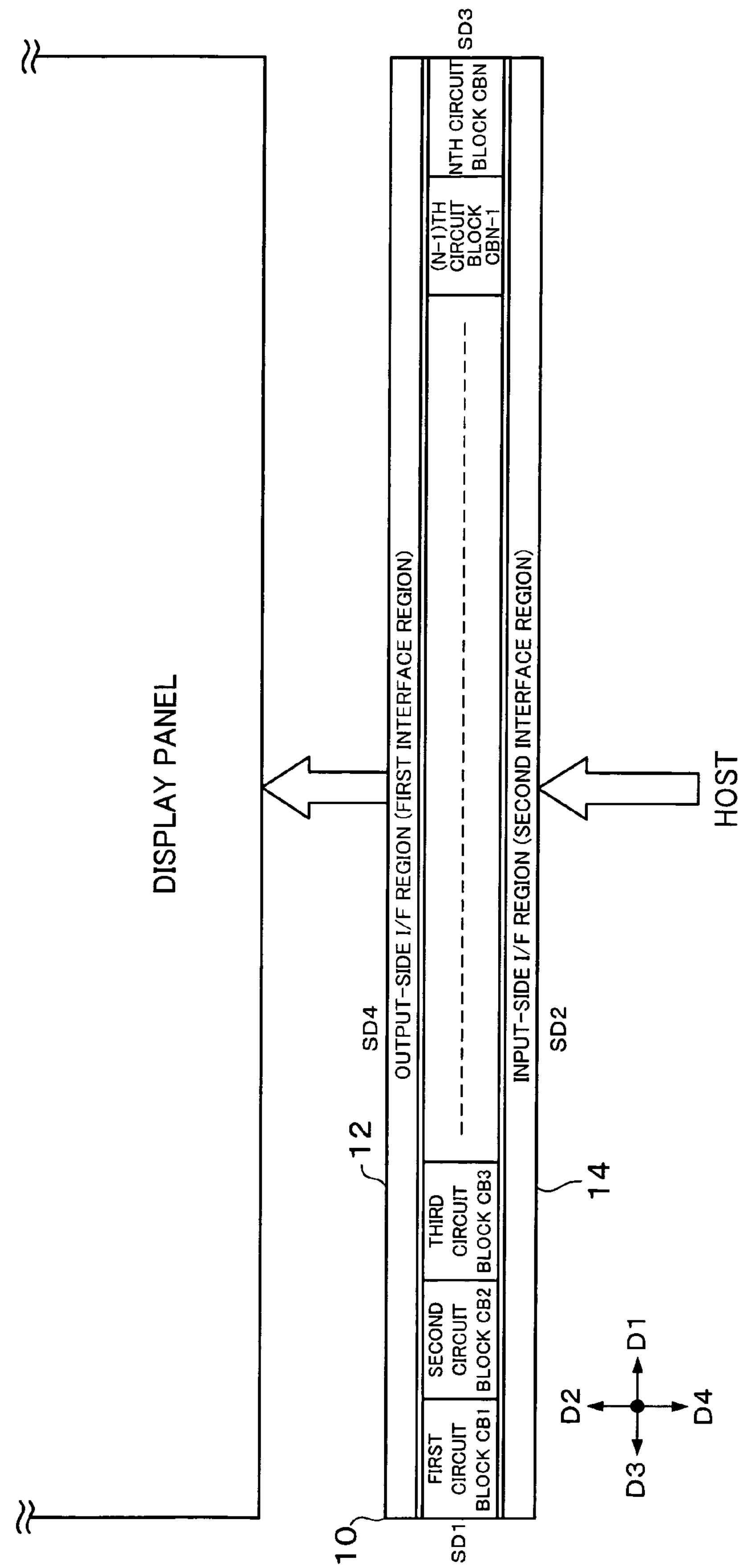
FIG. 3 is a configuration example of an integrated circuit device of the embodiment.

FIG. 3 shows a configuration example of an integrated circuit device 10 of one embodiment of the invention which can solve the above-described problems. In the embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 of the embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in the embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example.

When the display panel is a touch panel, the output-side I/F region 12 may include input transistors.

The input-side I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
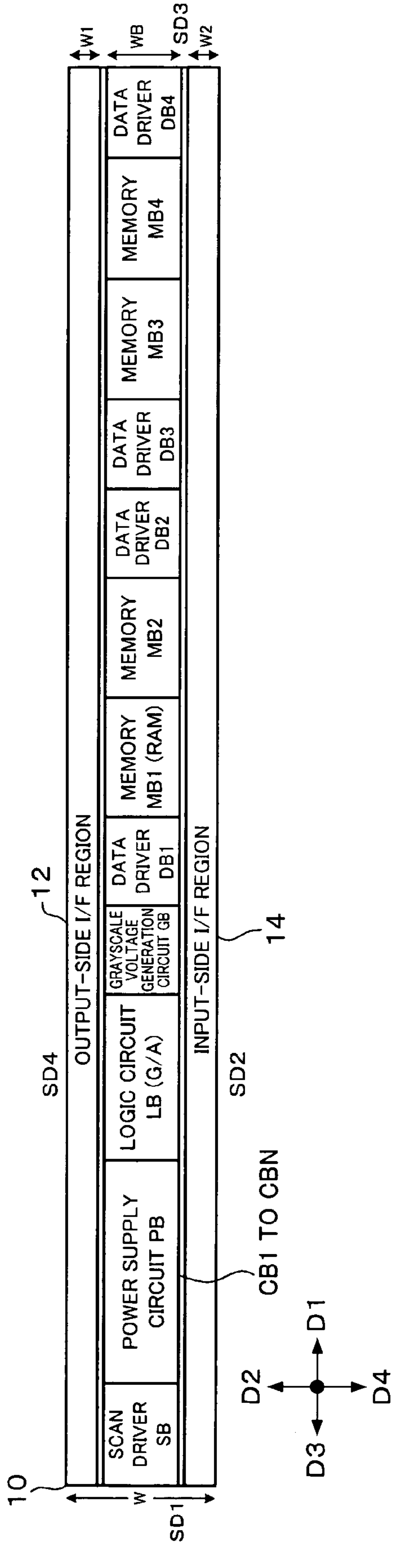
FIGS. 5A and 5B are planar layout examples of the integrated circuit device of the embodiment.
Figure 5B:
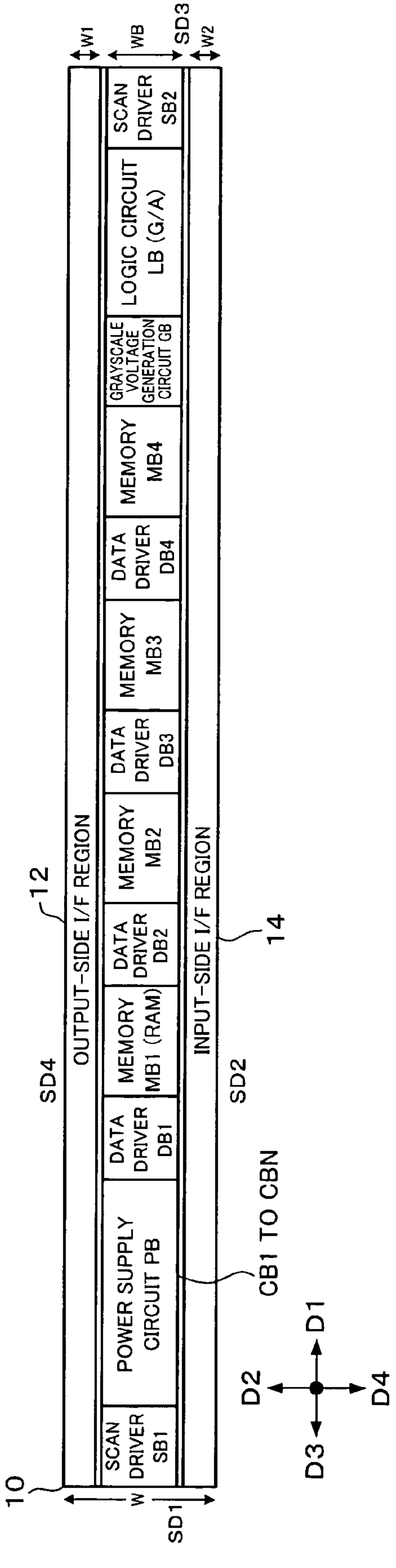

FIGS. 5A and 5B show examples of a planar layout of the integrated circuit device 10 as the display driver of the embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leqq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the interconnect pitch of the data signal output lines from the data driver blocks DB1 to DB4 to the output-side I/F region 12 can be equalized so that the interconnect efficiency can be increased.

The layout arrangement of the integrated circuit device 10 of the embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
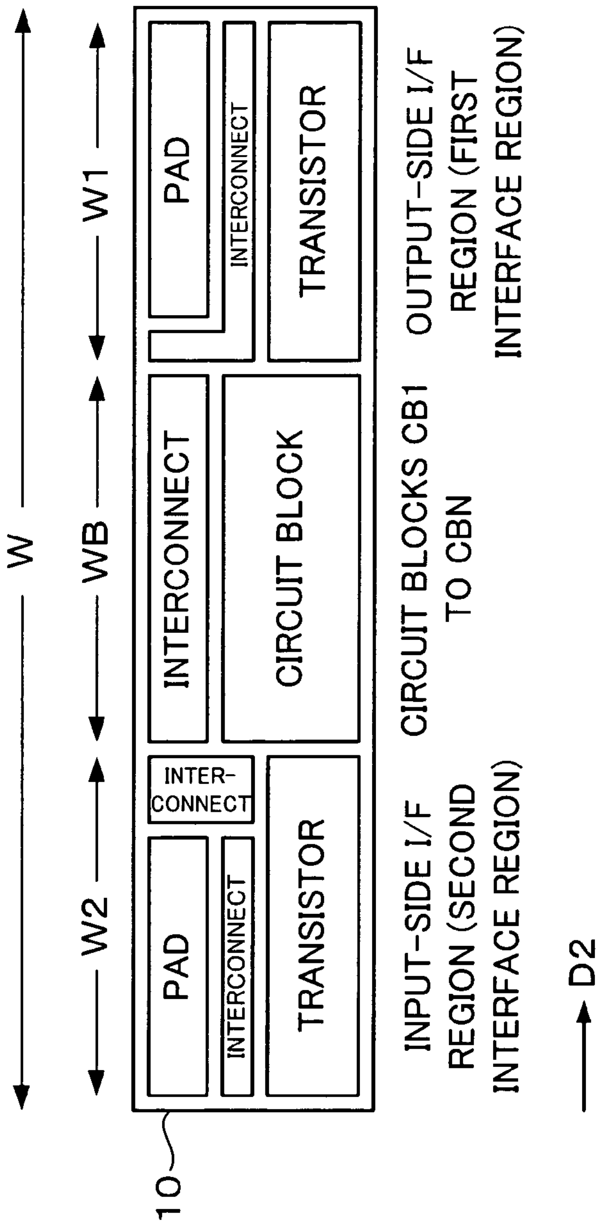
FIGS. 6A and 6B are examples of cross-sectional diagrams of the integrated circuit device.
Figure 6B:
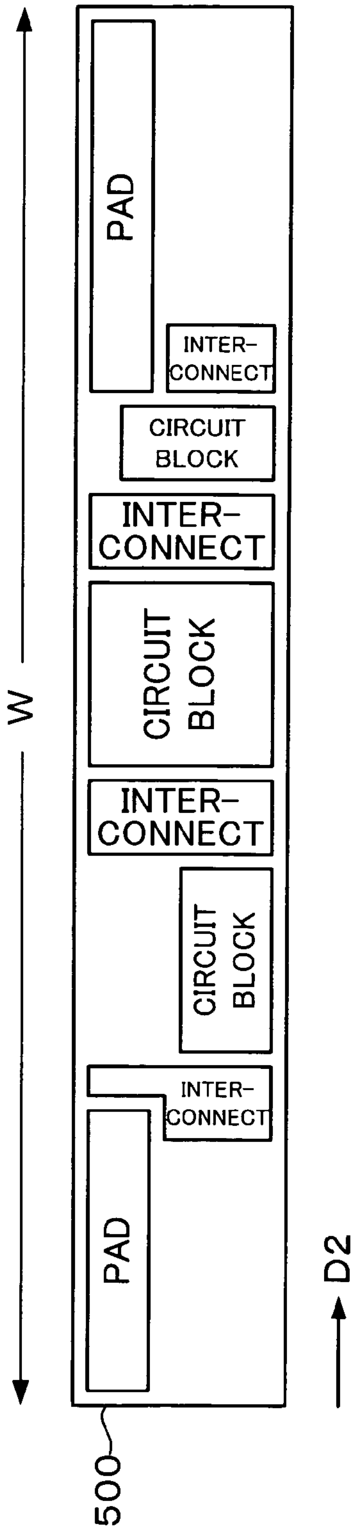

FIG. 6A is an example of a cross-sectional diagram of the integrated circuit device of the embodiment along the direction D2, and FIG. 6B is an example of a cross-sectional diagram of the comparative example. In the comparative example shown in FIG. 1A, two or more circuit blocks are disposed along the direction D2 as shown in FIG. 6B. Moreover, interconnect regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a macrofabrication technology, the length LD in the direction D1 (long side direction) is decreased, as shown in FIG. 2A, so that the output pitch becomes narrow, whereby it becomes difficult to mount the integrated circuit device 500.

Figure 2B:
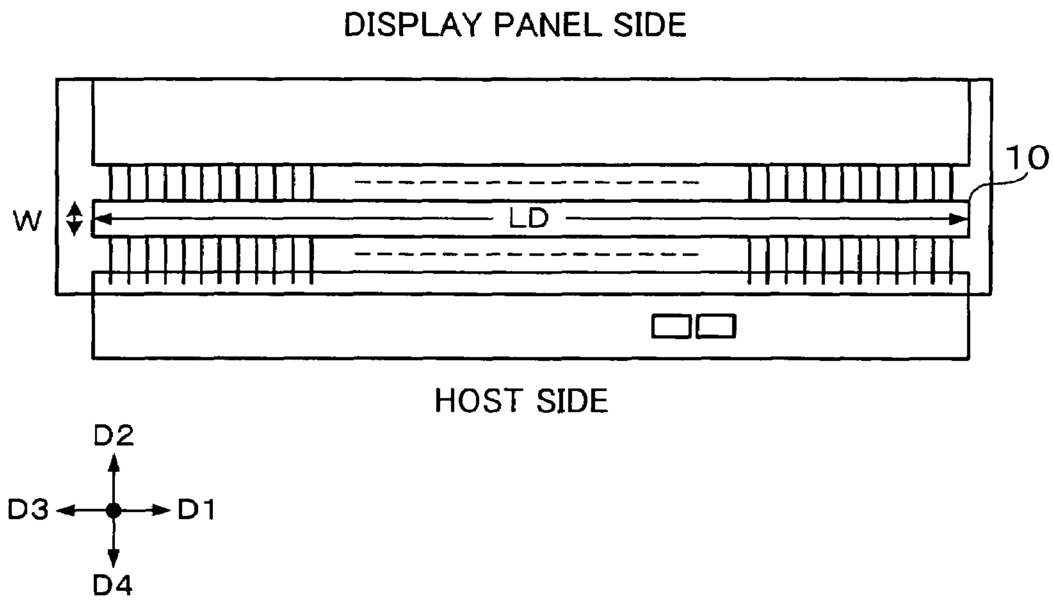

In the embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global interconnects formed in the upper layer (lower layer of the pad) of the local interconnects in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In the embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In the embodiment, even if the circuit block is removed corresponding to the specification, since the effect on the remaining circuit blocks is minimized, the design efficiency can be increased.

In the embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block The input-side I/F region 14 (second I/O region) is disposed on the D4 side of the circuit blocks CB1 to CBN, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional interconnect region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of the embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In the embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
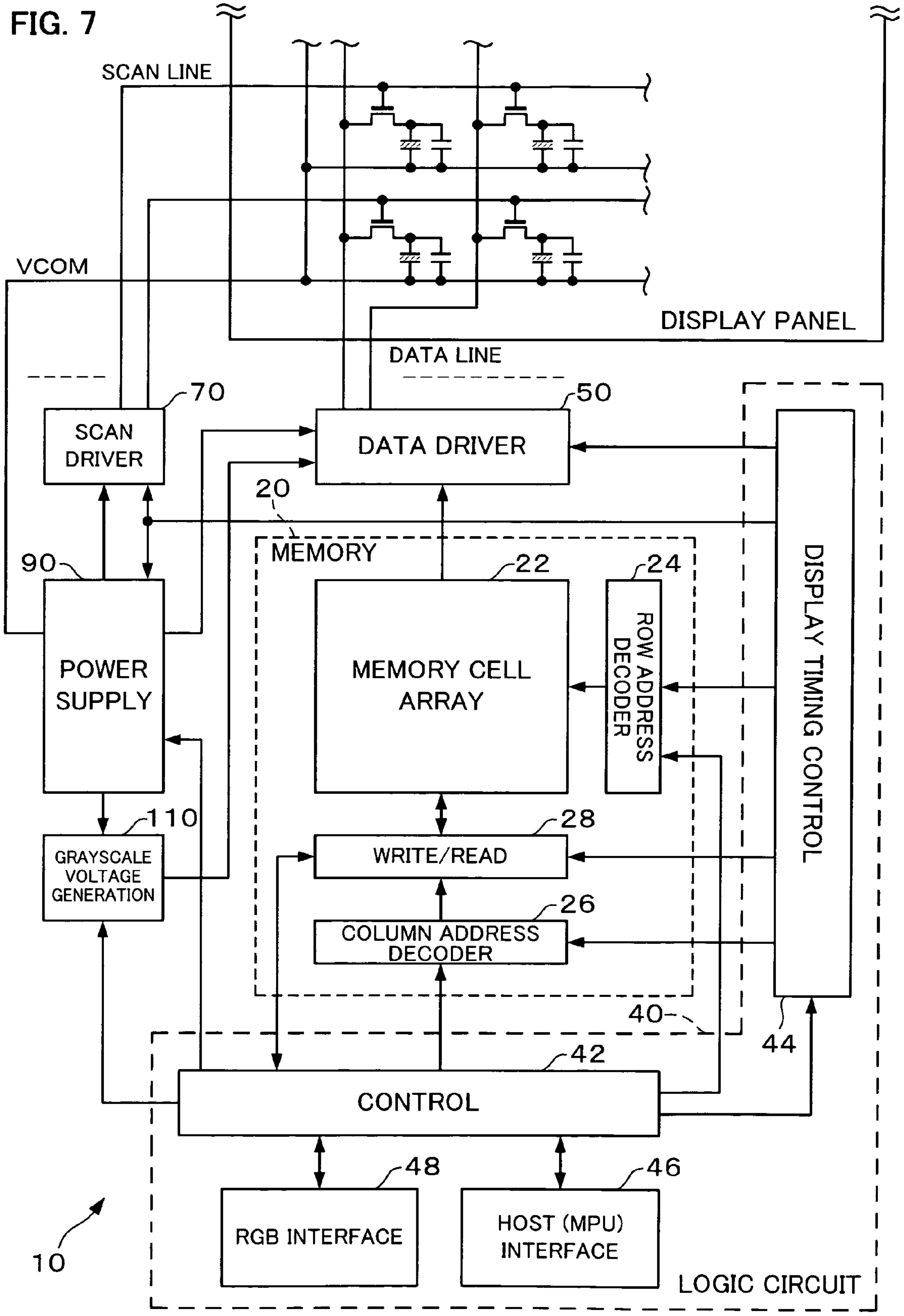
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
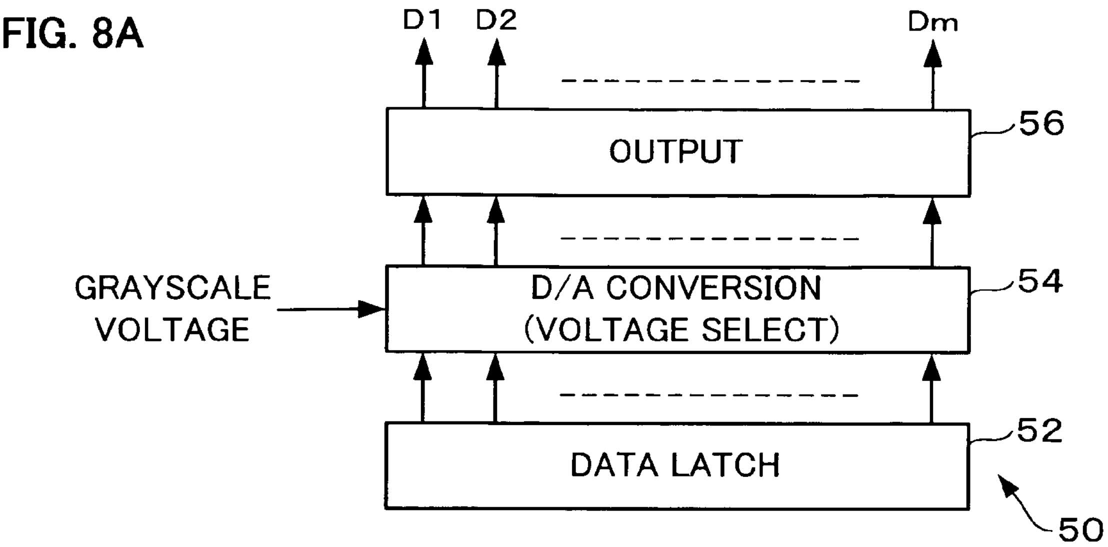
FIGS. 8A, 8B, and 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
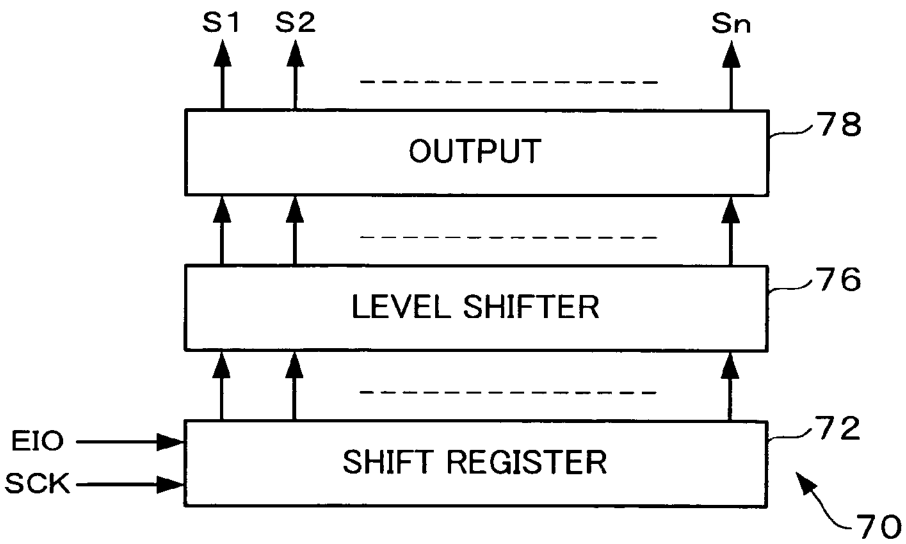
Figure 8C:
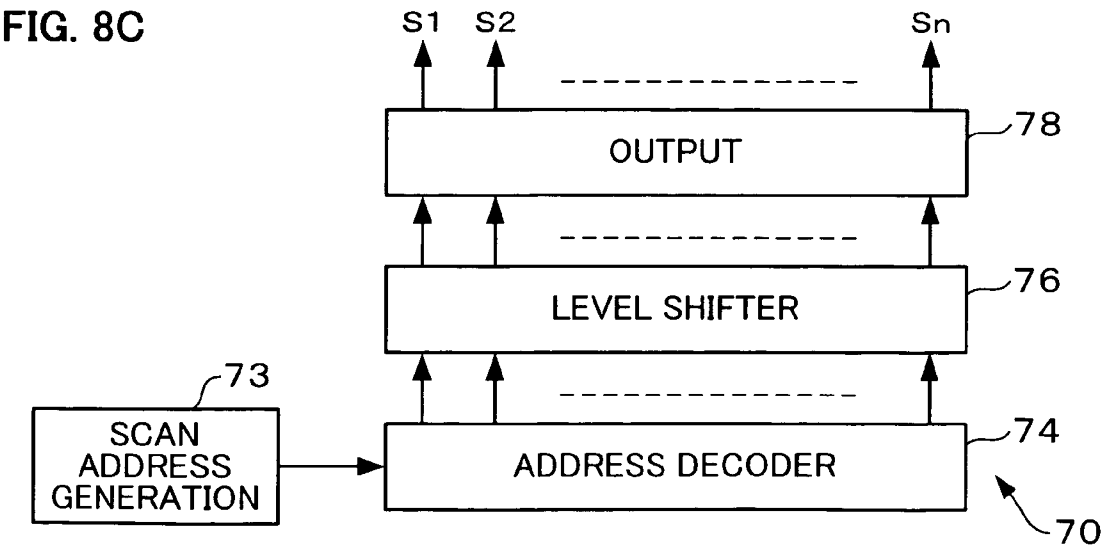

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
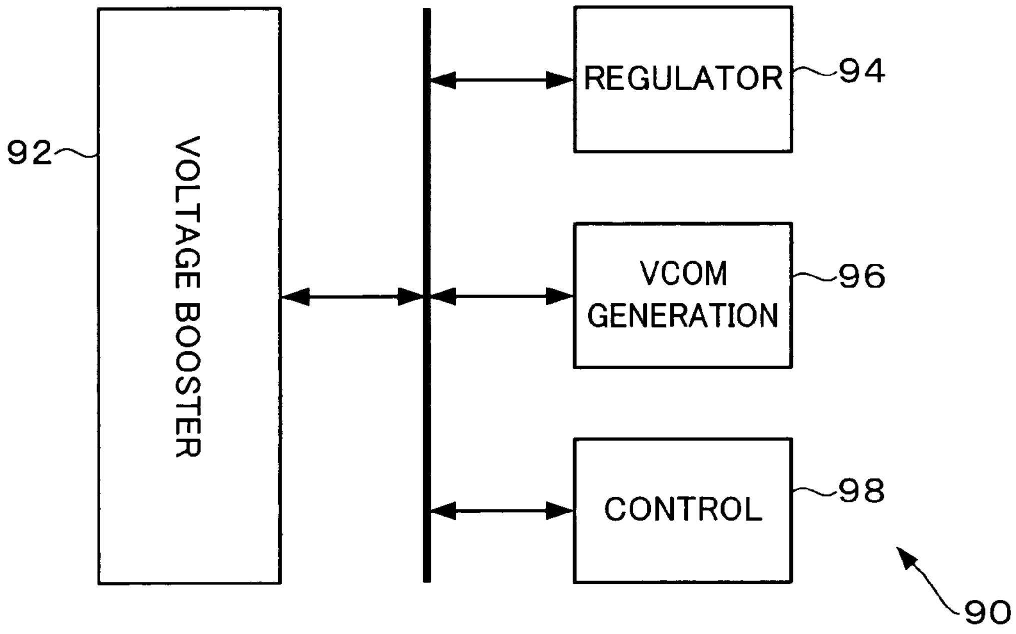
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
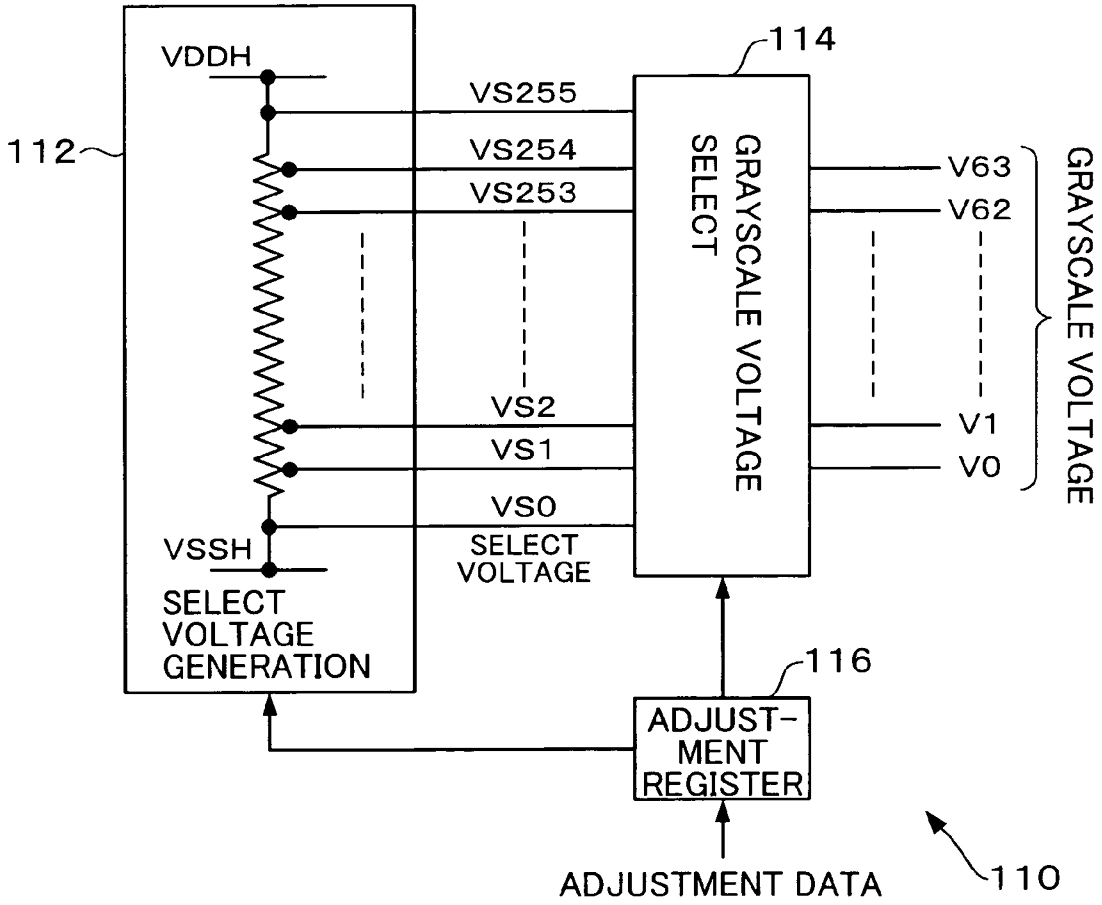

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
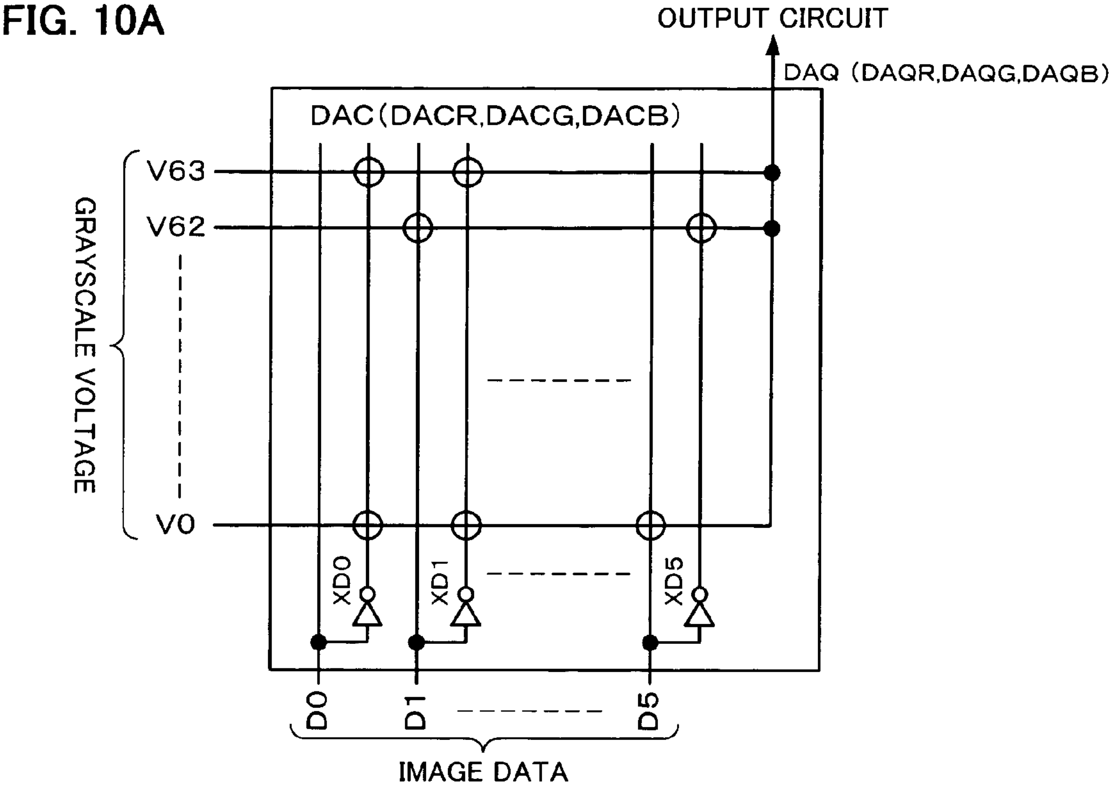
FIGS. 10A, 10B, and 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
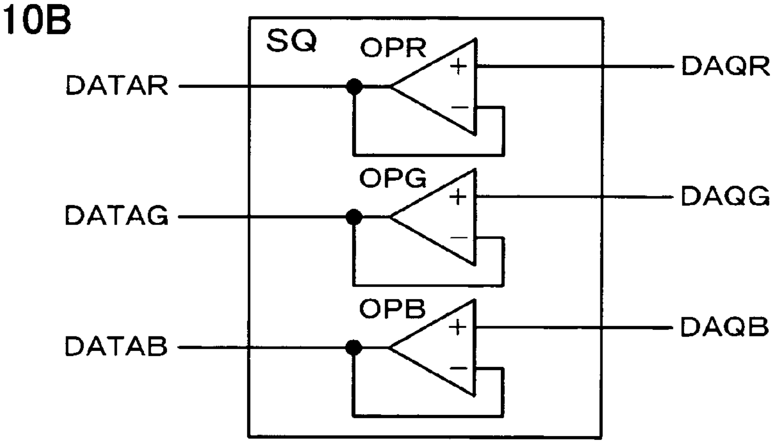
Figure 10C:
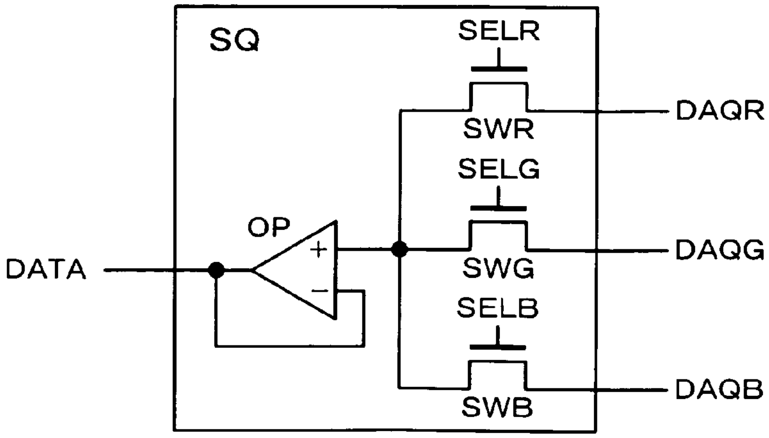

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, G, and B data signals are multiplexed. The data signals may be multiplexed over a plurality of pixels. Only the switch elements and the like may be provided in the output section SQ without providing the impedance conversion circuit as shown in FIGS. 10B and 10C.

4. Width of Integrated Circuit Device 4.1 Slim Integrated Circuit Device

Figure 11A:
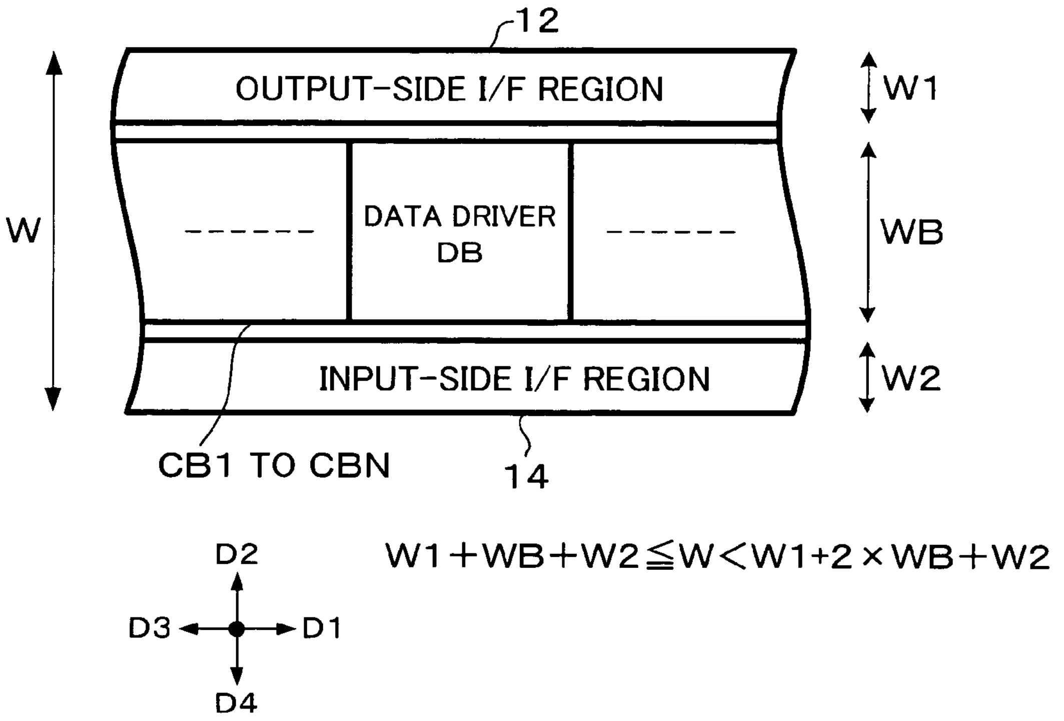
FIGS. 11A and 11B are illustrative of the width of the integrated circuit device.

In the embodiment, the first to Nth circuit blocks CB1 to CBN include at least one data driver block DB for driving the data lines, as shown in FIG. 11A. The first to Nth circuit blocks CB1 to CBN include a circuit block other than the data driver block DB (circuit block which realizes a function differing from the function of the data driver block DB). The circuit block other than the data driver block DB is a logic circuit block (40 in FIG. 7), for example. Or, the circuit block other than the data driver block DB is a grayscale voltage generation circuit block (110 in FIG. 7) or a power supply circuit block (90 in FIG. 7). Or, the circuit block other than the data driver block DB is a memory block (20 in FIG. 7) when the integrated circuit device includes a memory, or a scan driver block (70 in FIG. 7) when the integrated circuit device is an amorphous TFT integrated circuit device.

In FIG. 11A, W1, WB, and W2 respectively indicate the widths of the output-side I/F region 12 (first interface region), the first to Nth circuit blocks CB1 to CBN, and the input-side I/F region 14 (second interface region) in the direction D2.

In the embodiment, when the width of the integrated circuit device 10 in the direction D2 is W, "W1+WB+W2≦W<W1+2×WB+W2" is satisfied, as shown in FIG. 11A. In the comparative example shown in FIG. 6B, two or more circuit blocks are disposed along the direction D2. Therefore, the width W in the direction D2 is equal to or greater than "W1+2×WB+W2". In the embodiment, the output-side I/F region 12 is disposed on the D2 side of the data driver block DB (or the memory block)without another circuit block interposed therebetween. Specifically, the data driver block DB and the output-side I/F region 12 are disposed adjacent to each other. The input-side I/F region 14 is disposed on the D4 side of the data driver block DB (or the memory block) without another circuit block interposed therebetween. Specifically, the data driver block DB and the input-side I/F region 14 are disposed adjacent to each other. In this case, another circuit block refers to a major macro circuit block (e.g. grayscale voltage generation circuit block, power supply circuit block, memory block, or logic circuit block) which makes up the display driver, for example.

In the comparative example shown in FIGS. 1A and 6B, since the width W is equal to or greater than "W1+2×WB+W2", the width W of the integrated circuit device 500 in the direction D2 (short side direction) is increased, whereby a slim chip cannot be realized. Therefore, even if the chip is shrunk by using a macrofabrication technology, the length LD in the direction D1 (long side direction) is decreased, as shown in FIG. 2A, so that the output pitch becomes narrow, whereby it becomes difficult to mount the integrated circuit device 500.

In the embodiment, since other circuit blocks do not exist between the data driver block DB and the I/F regions 12 and 14, "W<W1+2×WB+W2" is satisfied. Therefore, since the width W of the integrated circuit device in the direction D2 can be reduced, a slim chip as shown in FIG. 2B can be realized. In more detail, the width W in the direction D2 (short side direction) may be set at "W<2 mm". More specifically, the width W in the direction D2 may be set at "W<1.5 mm". It is preferable that "W>0.9 mm" taking inspection and mounting of the chip into consideration. The length LD in the long side direction may be set at "15 mm<LD<27 mm". A chip shape ratio SP=LD/W may be set at "SP>10". More specifically, the chip shape ratio SP may be set at "SP>12". This realizes a slim integrated circuit device in which W=1.3 mm, LD=22 mm, and SP=16.9 or W=1.35 mm, LD=17 mm, and SP=12.6 corresponding to the specification such as the number of pins, for example. This facilitates mounting as shown in FIG. 2B. Moreover, cost can be reduced due to a decrease in the chip area. Specifically, facilitation of mounting and a reduction in cost can be achieved in combination.

Figure 11B:
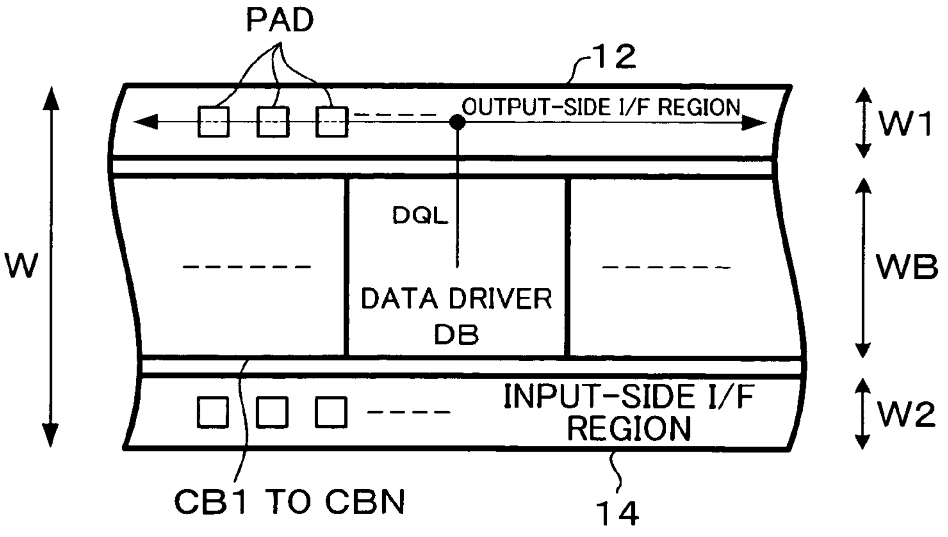

The arrangement method of the comparative example shown in FIG. 1A is reasonable taking the flow of the image data signal into consideration. In the embodiment, the data signal output line DQL from the data driver block DB is disposed in the data driver block DB along the direction D2, as shown in FIG. 1B. On the other hand, the data signal output line DQL is disposed in the output-side I/F region 12 (first interface region) along the direction D1 (D3). In more detail, the data signal output line DQL is disposed in the output-side I/F region 12 along the direction D1 by using the global interconnect located in the lower layer of the pad and in the upper layer of the local interconnect (transistor interconnect) inside the output-side I/F region 12. This enables the data signal from the data driver block DB to be properly output to the display panel through the pad, even when employing the arrangement method in which other circuit blocks do not exist between the data driver block DB and the I/F regions 12 and 14 as shown in FIG. 11A. Moreover, if the data signal output line DQL is disposed as shown in FIG. 11B, the data signal output line DQL can be connected with the pads or the like by utilizing the output-side I/F region 12, whereby an increase in the width W of the integrated circuit device in the direction D2 can be prevented.

The widths W1, WB, and W2 shown in FIG. 11A indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic protection elements, and the like are formed in the I/F regions 12 and 14. Transistors which make up the circuits are formed in the circuit blocks CB1 to CBN. The widths W1, WB, and W2 are determined based on well regions and diffusion regions in which the transistors are formed. In order to realize a slim integrated circuit device, it is preferable to form bumps (active surface bumps) on the transistors of the circuit blocks CB1 to CBN. In more detail, a resin core bump, in which the core is formed of a resin and a metal layer is formed on the surface of the resin, or the like is formed on the transistor (active region). The bumps (external connection terminals) are connected with the pads disposed in the I/F regions 12 and 14 through metal interconnects. The widths W1, WB, and W2 of the embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 microns (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. In the case where the integrated circuit device includes a memory, the maximum width may be the width of the memory block in the direction D2. A vacant region having a width of about 20 to 30 microns may be provided between the circuit blocks CB1 to CBN and the I/F regions 12 and 14, for example.

4.2 Width of Data Driver Block

Figure 12A:
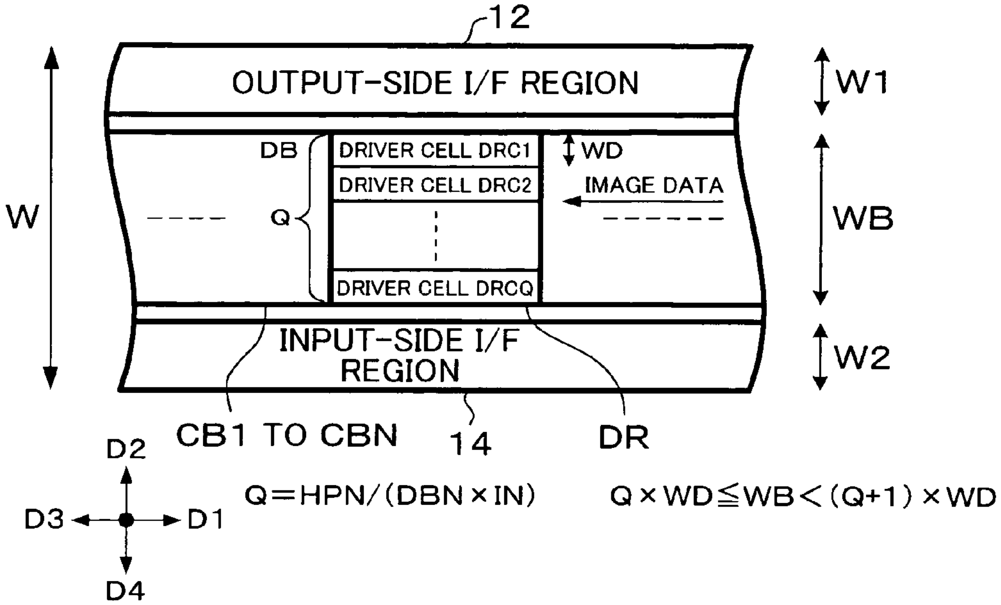
FIGS. 12A to 12E are illustrative of the width of a data driver block.

In the embodiment, the data driver DR included in the data driver block DB may include Q driver cells DRC1 to DRCQ disposed along the direction D2, as shown in FIG. 12A. Each of the driver cells DRC1 to DRCQ receives image data for one pixel. Each of the driver cells DRC1 to DRCQ performs D/A conversion of the image data for one pixel, and outputs data signals corresponding to the image data for one pixel. Each of the driver cells DRC1 to DRCQ may include a data latch circuit, the DAC (DAC for one pixel) shown in FIG. 10A, and the output section SQ shown in FIGS. 10B and 10C.

When the width (pitch) of the driver cells DRC1 to DRCQ in the direction D2 is WD, the width WB (maximum width) of the circuit blocks CB1 to CBN in the direction D2 may be set at "$Q \times WD \leqq WB < (Q+1) \times WD$" as shown in FIG. 12A.

Specifically, the circuit blocks CB1 to CBN are disposed along the direction D1 in the embodiment. Therefore, a signal line of image data input from another circuit block (e.g. logic circuit block or memory block) of the circuit blocks CB1 to CBN to the data driver block DB is disposed along the direction D1. The driver cells DRC1 to DRCQ are disposed along the direction D2 as shown in FIG. 12A so as to be connected with the signal lines of image data disposed along the direction D1. Each of the driver cells DRC1 to DRCQ is connected with the signal lines of image data for one pixel.

In the case of an integrated circuit device which does not include a memory, the width WB of the circuit blocks CB1 to CBN may be determined based on the width of the data driver DB in the direction D2, for example. Therefore, in order to reduce the width WB of the circuit blocks CB1 to CBN by reducing the width of the data driver block DB in the direction D2, it is preferable to set the width WB at about "$Q \times WD$" which is the width in which the driver cells DRC1 to DRCQ are arranged. The width WB is "$Q \times WD \leqq WB < (Q+1) \times WD$" taking the margin for the interconnect region or the like into consideration. This enables the width WB of the circuit blocks CB1 to CBN to be reduced by minimizing the width of the data driver block DB in the direction D2, whereby a slim integrated circuit device as shown in FIG. 2B can be provided.

Suppose that the number of pixels of the display panel in the horizontal scan direction (the number of pixels in the horizontal scan direction driven by each integrated circuit device when a plurality of integrated circuit devices cooperate to drive the data lines of the display panel) is HPN, the number of data driver blocks (number of block divisions) is DBN, and the number of inputs of image data to the driver cell in one horizontal scan period is IN. The number of inputs IN is equal to the number of readings RN of image data in one horizontal scan period as described later. In this case, the number Q of driver cells DRC1 to DRCQ disposed along the direction D2 may be expressed as "$Q = HPN/(DBN \times IN)$". When HPN=240, DBN=4, and IN=2, $Q = 240/(4 \times 2) = 30$.

Figure 12B:
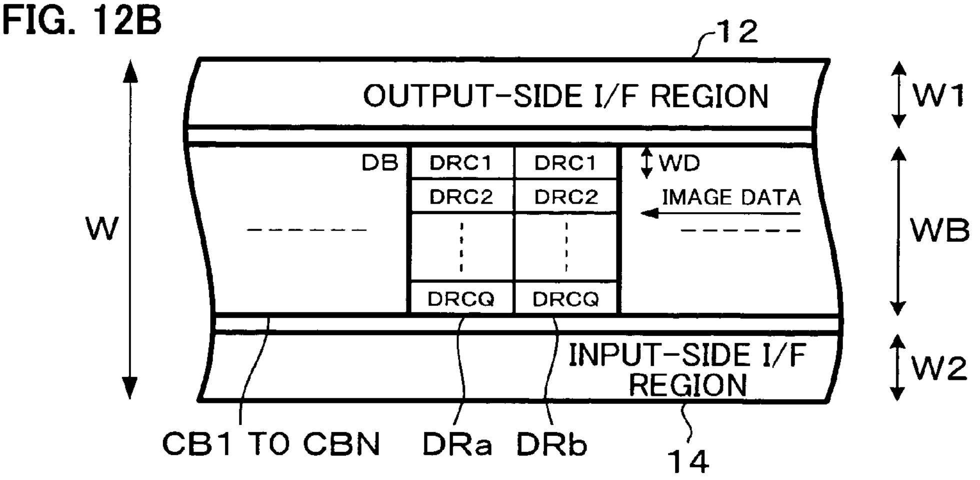

As shown in FIG. 12B, the data driver block DB may include a plurality of data drivers DRa and DRb (first to mth data drivers) disposed along the direction D1. A problem in which the width W of the integrated circuit device in the direction D2 is increased due to an increase in the scale of the data driver can be prevented by disposing (stacking) the data drivers DRa and DRb along the direction D1. The data driver is configured in various ways depending on the type of display panel. In this case, the data driver having various configurations can be efficiently arranged by disposing the data drivers along the direction D1. FIG. 12B shows the case where the number of data drivers disposed in the direction D1 is two. However, the number of data drivers disposed in the direction D1 may be three or more.

Figure 12C:
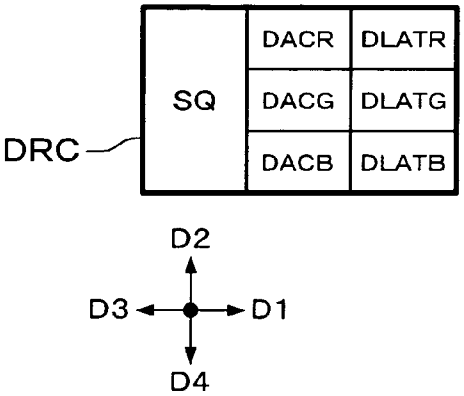

FIG. 12C shows an example of the configuration and the arrangement of the driver cell DRC. The driver cell DRC which receives image data for one pixel includes R (red), G (green), and B (blue) data latch circuits DLATR, DLATG, and DLATB. Each of the data latch circuits DLATR, DLATG, and DLATB latches image data when the latch signal goes active. The driver cell DRC includes the R, G, and B digital-analog converters DACR, DACG, and DACB described with reference to FIG. 10A. The driver cell DRC also includes the output section SQ described with reference to FIGS. 10B and 10C.

Figure 12D:
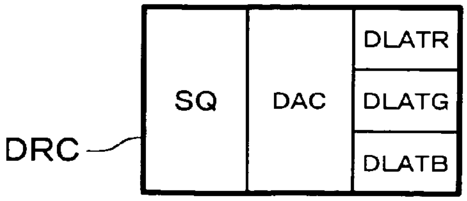
Figure 12E:
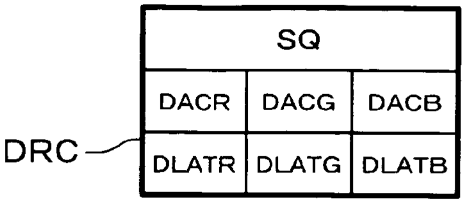

The configuration and the arrangement of the driver cell DRC are not limited to those shown in FIG. 12C. Various modifications and variations may be made. For example, when a low-temperature polysilicon TFT display driver or the like multiplexes and supplies R, G, and B data signals to the display panel as shown in FIGS. 10C, R, G, and B image data (image data for one pixel) may be D/A converted by using one common DAC. In this case, it suffices that the driver cell DRC include one common DAC having the configuration shown in FIG. 10A, as shown in FIG. 12D. In FIGS. 12C and 12D, the R circuits (DLATR and DACR), the G circuits (DLATG and DACG), and the B circuits (DLATB and DACB) are disposed along the direction D2 (D4). However, the R, G, and B circuits may be disposed along the direction D1 (D3) , as shown in FIG. 12E.

4.3 Width of Memory Block

Figure 13A:
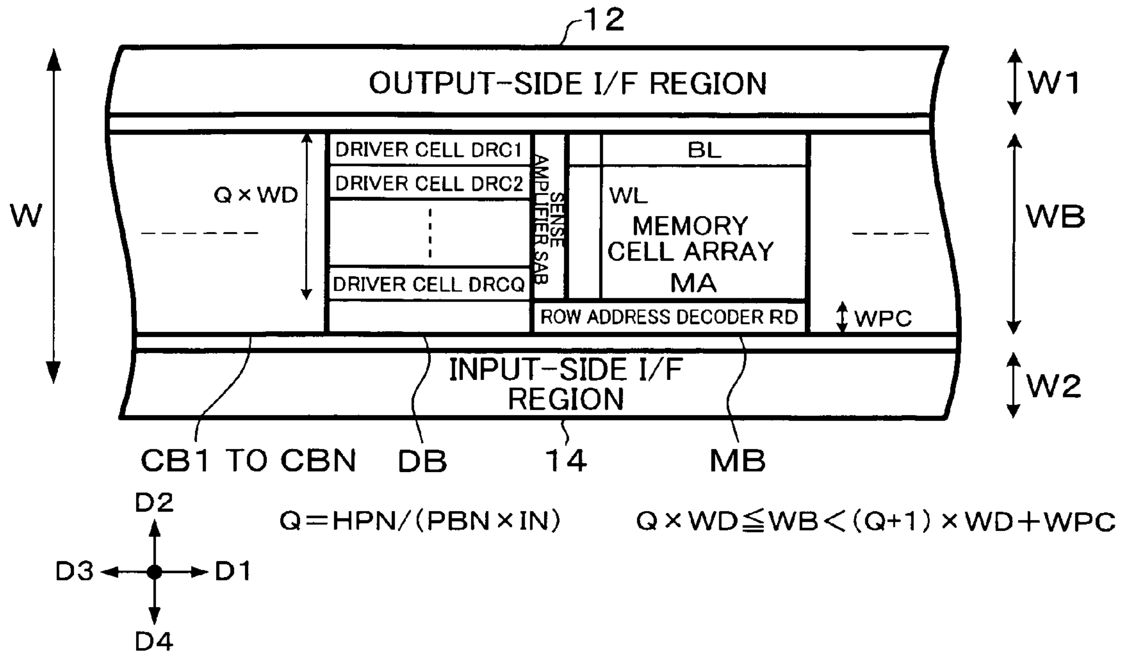
FIGS. 13A and 13B are illustrative of the width of a memory block.

In the integrated circuit device including a memory, the data driver block DB and the memory block MB may be disposed adjacent to each other in the direction D1, as shown in FIG. 13A.

Figure 14A:
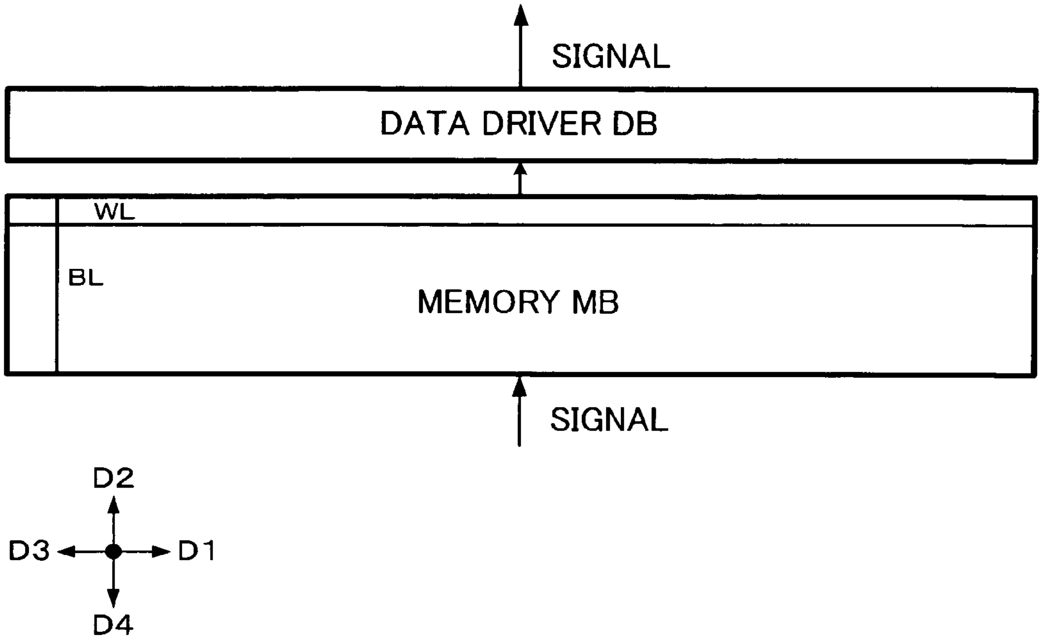
FIGS. 14A and 14B are illustrative of a comparative example.

In the comparative example shown in FIG. 1A, the memory block MB and the data driver block DB are disposed along the direction D2 (short side direction) corresponding to the signal flow, as shown in FIG. 14A. Therefore, since the width of the integrated circuit device in the direction D2 is increased, it is difficult to realize a slim chip. Moreover, when the number of pixels of the display panel, the specification of the display driver, the configuration of the memory cell, or the like is changed so that the width in the direction D2 or the length in the direction D1 of the memory block MB or the data driver block DB is changed, the remaining circuit blocks are affected by such a change, whereby the design efficiency is decreased.

In FIG. 13A, since the data driver block DB and the memory block MB are disposed adjacent to each other in the direction D1, the width W of the integrated circuit device in the direction D2 can be reduced. Moreover, since it is possible to deal with a change in the number of pixels of the display panel or the like by dividing the memory block, the design efficiency can be improved.

Figure 14B:
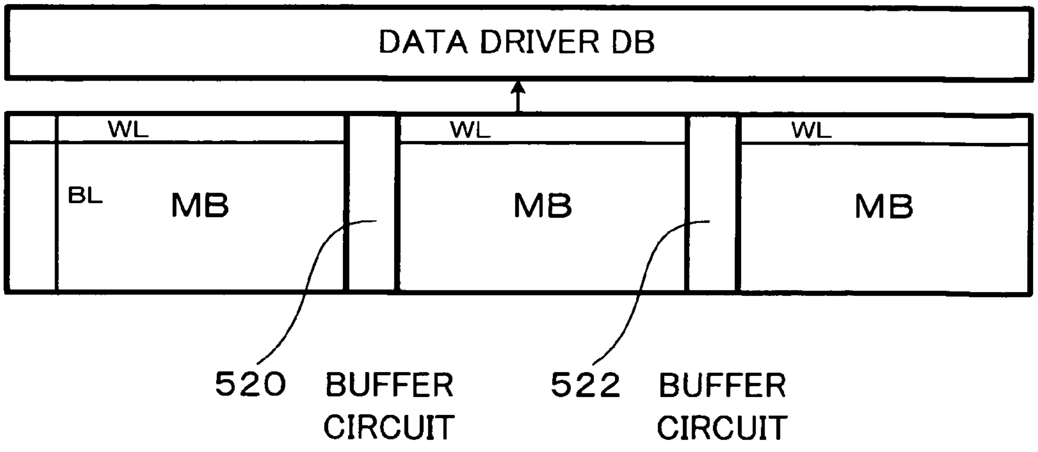

In the comparative example shown in FIG. 14A, since the wordline WL is disposed along the direction D1 (long side direction), a signal delay in the wordline WL is increased, whereby the image data read speed is decreased. In particular, since the wordline WL connected with the memory cells is formed by a polysilicon layer, the signal delay problem is serious. In this case, buffer circuits 520 and 522 as shown in FIG. 14B may be provided in order to reduce the signal delay. However, use of this method increases the circuit scale, whereby cost is increased.

In FIG. 13A, the wordline WL is disposed in the memory block MB along the direction D2 (short side direction), and the bitline BL is disposed along the direction D1 (long side direction). In the embodiment, the width W of the integrated circuit device in the direction D2 is small. Therefore, since the length of the wordline WL in the memory block MB can be reduced, a signal delay in the wordline WL can be significantly reduced in comparison with the comparative example shown in FIG. 14A. Moreover, since it is unnecessary to provide the buffer circuits 520 and 522 as shown in FIG. 14B, the circuit area can be reduced. In the comparative example shown in FIG. 14A, since the wordline WL, which is long in the direction D1 and has a large parasitic capacitance, is selected even when a part of the access region of the memory is accessed by the host, power consumption is increased. On the other hand, according to the method of dividing the memory into blocks in the direction D1 as in the embodiment, since only the wordline WL of the memory block corresponding to the access region is selected during host access, a reduction in power consumption can be realized.

In the embodiment, when the width of the peripheral circuit section included in the memory block in the direction D2 is WPC, "$Q\times WD \leqq WB<(Q+1)\times WD+WPC$" may be satisfied, as shown in FIG. 13A. The peripheral circuit section used herein refers to a peripheral circuit (e.g. row address decoder or control circuit) or an interconnect region disposed on the D2 or D4 side of the memory cell array MA or disposed between divided memory cell arrays, for example.

In the arrangement shown in FIG. 13A, it is preferable that the width "$Q\times WD$" of the driver cells DRC1 to DRCQ coincide with the width of the sense amplifier block SAB. If the width "$Q\times WD$" of the driver cells DRC1 to DRCQ does not coincide with the width of the sense amplifier block SAB, it necessary to change the interconnect pitch of the signal lines when connecting the image data signal lines from the sense amplifier block SAB with the driver cells DRC1 to DRCQ, whereby an unnecessary interconnect region is provided.

The memory block MB includes the peripheral circuit section such as the row address decoder RD in addition to the memory cell array MA. Therefore, the width of the memory block MB shown in FIG. 13A is greater than the width "$Q\times WD$" of the driver cells DRC1 to DRCQ in an amount corresponding to the width WPC of the peripheral circuit section.

In the case of an integrated circuit device including a memory, the width WB of the circuit blocks CB1 to CBN may be determined based on the width of the memory block MB in the direction D2. Therefore, in order to reduce the width WB of the circuit blocks CB1 to CBN by reducing the width of the memory block MB in the direction D2, it is preferable to set the width WB at "$Q\times WD \leqq WB<(Q+1)\times WD+WPC$". This enables the width WB to be reduced by minimizing the width of the memory block MB in the direction D2, whereby a slim integrated circuit device as shown in FIG. 2B can be provided.

Figure 13B:
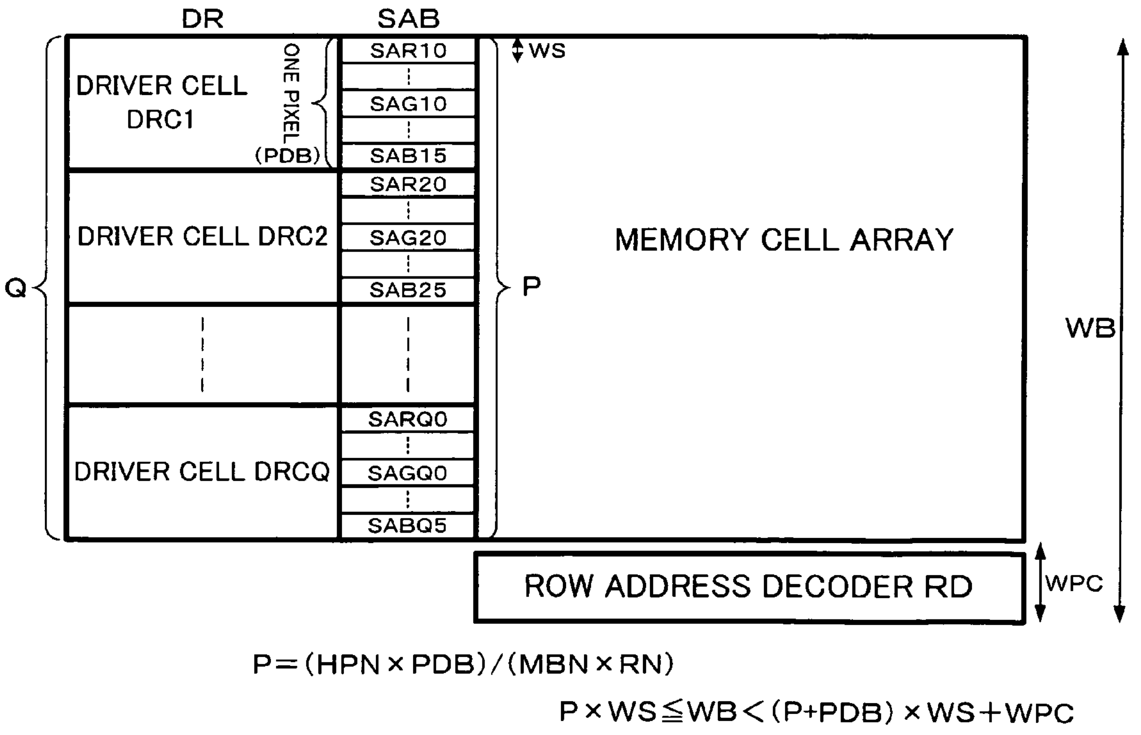

FIG. 13B shows the arrangement relationship between the driver cells DRC1 to DRCQ and the sense amplifier block SAB. As shown in FIG. 13B, sense amplifiers for one pixel (R sense amplifiers SAR10 to SAR15, G sense amplifiers SAG10 to SAG15, and B sense amplifiers SAB10 to SAB15) are connected with the driver cell DRC1 which receives image data for one pixel. This also applies to connection between the remaining driver cells DRC2 to DRCQ and the sense amplifiers.

As shown in FIG. 13B, when the width of the peripheral circuit section (row address decoder RD) included in the memory block in the direction D2 is WPC and the number of bits of image data for one pixel is PDB, the width WB (maximum width) of the circuit blocks CB1 to CBN in the direction D2 may be expressed as "$P\times WS \leqq WB<(P+PDB)\times WS+WPC$". The number of bits PDB is 18 bits (PDB=18) when the number of bits is six bits each for R, G, and B.

Suppose that the number of pixels of the display panel in the horizontal scan direction is HPN, the number of bits of image data for one pixel is PDB, the number of memory blocks is MBN (=DBN), and the number of readings of image data from the memory block in one horizontal scan period is RN. In this case, the number P of sense amplifiers disposed in the sense amplifier block SAB along the direction D2 is expressed as "$PP=(HPN\times PDB)/(MBN\times RN)$".

The number P is the number of effective sense amplifiers corresponding to the number of effective memory cells, and excludes the number of ineffective sense amplifiers such as sense amplifiers for dummy memory cells. The number P is the number of sense amplifiers, each of which outputs 1-bit image data. For example, when selectively outputting 1-bit image data by using first and second sense amplifiers and a selector connected with outputs of the first and second sense amplifiers, the first and second sense amplifiers and the selector correspond to the sense amplifier which outputs 1-bit image data.

Figure 15A:
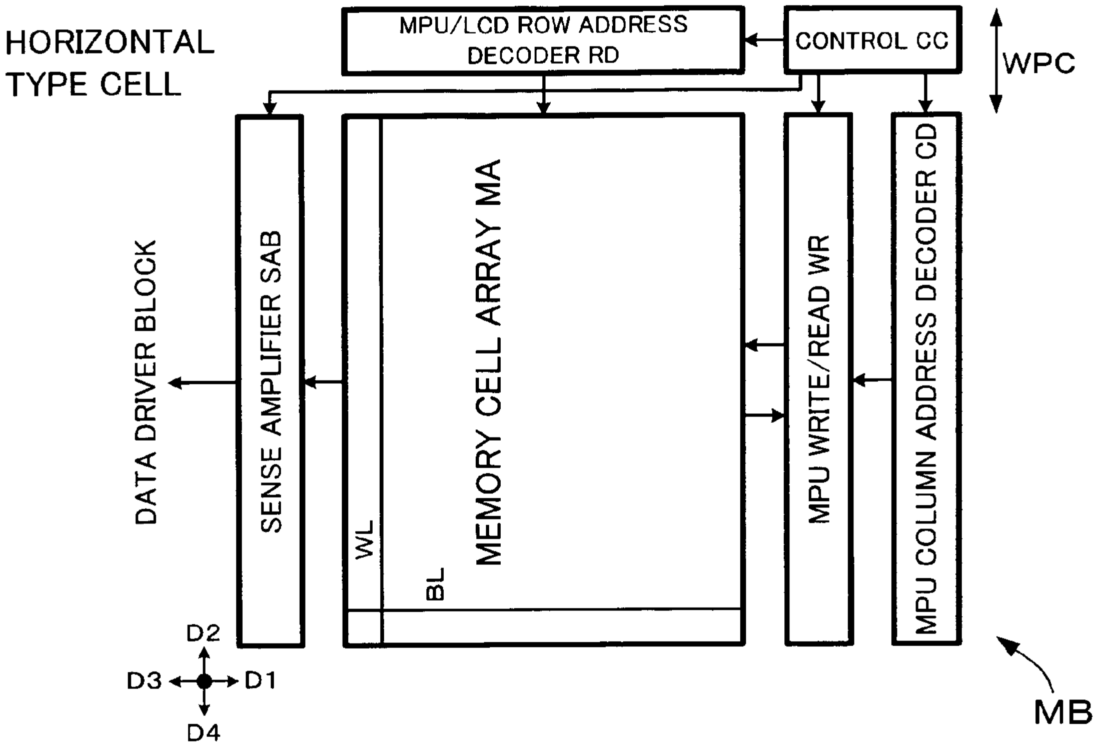
FIGS. 15A and 15B are configuration examples of the memory block.
Figure 15B:
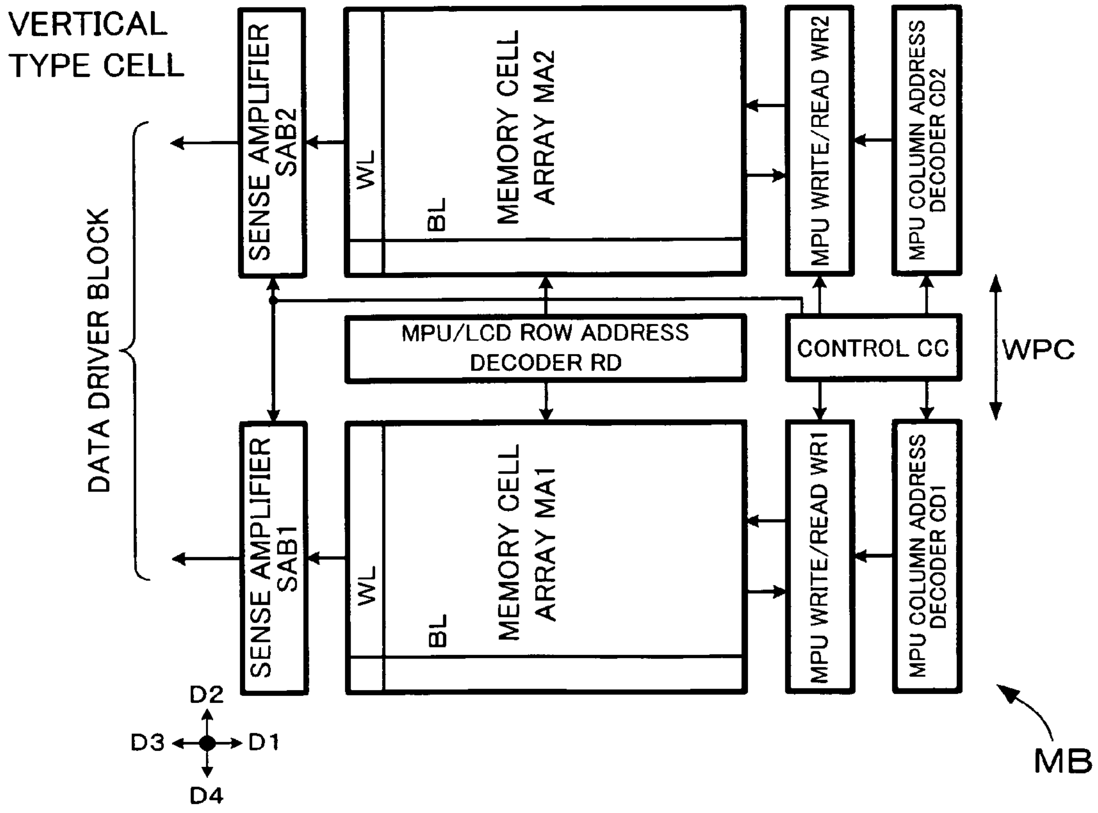

FIGS. 15A and 15B show detailed layout arrangement examples of the memory block MB. FIG. 15A is an arrangement example of the memory block MB when using a horizontal type cell described later. The MPU/LCD row address decoder RD controls wordline selection during host access and wordline selection during output to the data driver block (LCD). The sense amplifier block SAB amplifies a signal of image data read from the memory cell array MA during output to the data driver block, and outputs the image data to the data driver block. An MPU write/read circuit WR writes or reads image data into or from the access target memory cell (access region) of the memory cell array MA during the host access. The MPU write/read circuit WR may include a sense amplifier for reading image data. The MPU column address decoder CD controls selection of the bitline corresponding to the access target memory cell during the host access. A control circuit CC controls each circuit block in the memory block MB.

FIG. 15B is an arrangement example of the memory block MB when using a vertical type cell described later. In FIG. 15B, the memory cell array includes a first memory cell array MA1 and a second memory cell array MA2. The MPU/LCD row address decoder RD is provided between the memory cell arrays MA1 and MA2. The MPU/LCD row address decoder RD selects the wordline of one of the memory cell arrays MA1 and MA2 during the host access. The MPU/LCD row address decoder RD selects the wordlines of both the memory cell arrays MA1 and MA2 when outputting image data to the data driver block. According to this configuration, since only the wordline of the access target memory cell array can be selected during the host access, a signal delay in the wordline and power consumption can be reduced in comparison with the case of always selecting the wordlines of both memory cell arrays.

The MPU/LCD row address decoder RD, the control circuit CC, and the interconnect regions provided on the D2 (or D4) side of the memory cell array MA in FIG. 15A or provided between the memory cell arrays MA1 and MA2 in FIG. 15B make up the peripheral circuit section, and the width of the peripheral circuit section is WPC.

In the embodiment, the arrangement of the driver cell and the sense amplifier is described above on the assumption that the driver cell and the sense amplifier are disposed in pixel units. However, a modification in which the driver cell and the sense amplifier are disposed in subpixel units is also possible. The subpixels are not limited to the three subpixel configuration for RGB, and may have a four subpixel configuration for RGB+1 (e.g. white).

4.4 Relationship among WB, W1, and W2

Figure 16:
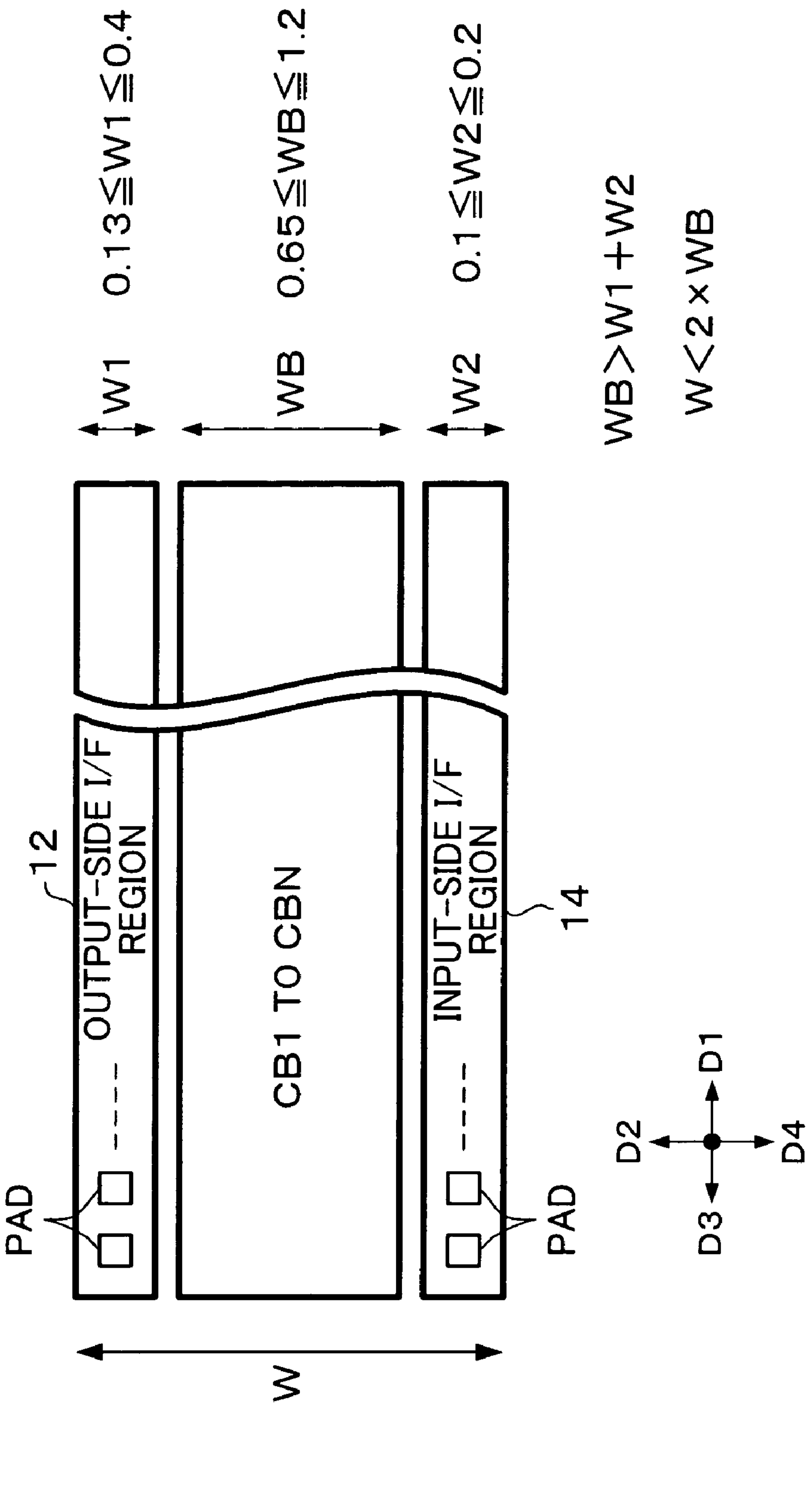
FIG. 16 is illustrative of the relationship among W1, W2, and WB.

In the embodiment, the width W1 of the output-side I/F region 12 in the direction D2 may be set at "0.13 mm≦W1≦0.4 mm", as shown in FIG. 16. The width WB of the circuit blocks CB1 to CBN may be set at "0.65 mm≦WB≦1.2 mm". The width W2 of the input-side I/F region 14 may be set at "0.1 mm≦W2≦0.2 mm".

In the output-side I/F region 12, a pad is disposed of which the number of stages in the direction D2 is one or more, for example. The width W1 of the output-side I/F region 12 is minimized by disposing output transistors, transistors for electrostatic protection elements, and the like under the pads as shown in FIG. 6A. Therefore, the width W1 is "0.13 mm≦W1≦0.4 mm" taking the pad width (e.g. 0.1 mm) and the pad pitch into consideration.

In the input-side I/F region 14, a pad is disposed of which the number of stages in the direction D2 is one. The width W2 of the input-side I/F region 14 is minimized by disposing input transistors, transistors for electrostatic protection elements, and the like under the pads as shown in FIG. 6A. Therefore, the width W2 is "0.1 mm≦W2≦0.2 mm" taking the pad width and the pad pitch into consideration. The number of stages of the pad in the direction D2 is set at one or more in the output-side I/F region 12 because the number (or size) of transistors which must be disposed under the pads is greater in the output-side I/F region 12 than in the input-side I/F region 14.

The width WB of the circuit blocks CB1 to CBN is set based on the width of the data driver block DB or the memory block MB in the direction D2 as described with reference to FIGS. 12A and 13A. In order to realize a slim integrated circuit device, interconnects for a logic signal from the logic circuit block, a grayscale voltage signal from the grayscale voltage generation circuit block, and a power supply must be formed on the circuit blocks CB1 to CBN by using global interconnects. The total width of these interconnects is about 0.8 to 0.9 mm, for example. Therefore, the width WB of the circuit blocks CB1 to CBN is "0.65 mm≦WB≦1.2 mm" taking the total width of these interconnects into consideration.

Since "0.65 mm≦WB≦1.2 mm" is satisfied even if W1=0.4 mm and W2=0.2 mm, WB>W1+W2 is satisfied. When the widths W1, WB, and W2 are minimum values, W1=0.13 mm, WB=0.65 mm, and W2=0.1 mm so that the width W of the integrated circuit device is about 0.88 mm. Therefore, "W=0.88 mm<2×WB=1.3 mm" is satisfied. When the widths W1, WB, and W2 are maximum values, W1=0.4 mm, WB=1.2 mm, and W2=0.2 mm so that the width W of the integrated circuit device is about 1.8 mm. Therefore, "W=1.8 mm<2×WB=2.4 mm" is satisfied. Specifically, "W<2×WB" is satisfied. If "W<2×WB" is satisfied, a slim integrated circuit device as shown in FIG. 2B can be realized.

5. Details of Memory Block and Data Driver Block 5.1 Block Division

Figure 17A:
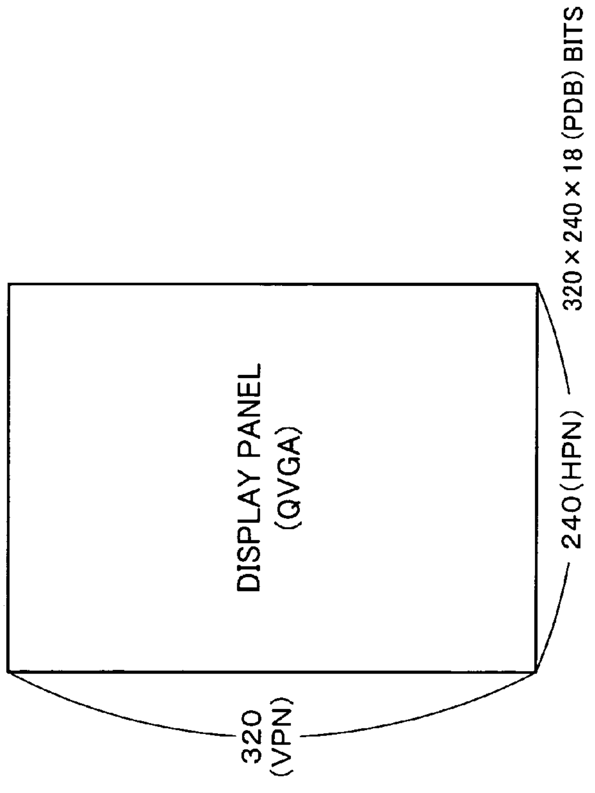
FIGS. 17A and 17B are illustrative of the arrangement of the memory block and the data driver block.

Suppose that the display panel is a QVGA panel in which the number of pixels VPN in the vertical scan direction (data line direction) is 320 and the number of pixels HPN in the horizontal scan direction (scan line direction) is 240, as shown in FIG. 17A. Suppose that the number of bits PDB of image (display) data for one pixel is 18 bits (six bits each for R, G, and B). In this case, the number of bits of image data necessary for displaying one frame of the display panel is "VPN×HPN×PDB=320×240×18" bits. Therefore, the memory of the integrated circuit device stores at least "320×240×18" bits of image data. The data driver outputs data signals for HPN=240 data lines (data signals corresponding to 240×18 bits of image data) to the display panel in one horizontal scan period (period in which one scan line is scanned).

Figure 17B:
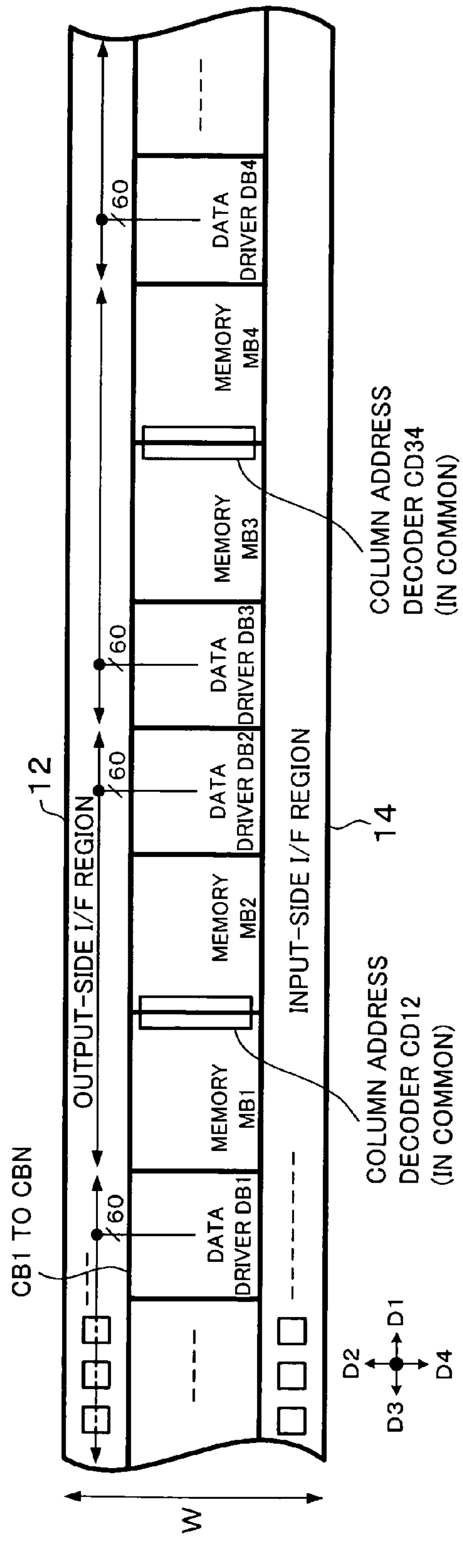

In FIG. 17B, the data driver is divided into four (DBN=4) data driver blocks DB1 to DB4. The memory is also divided into four (MBN=DBN=4) memory blocks MB1 to MB4. Therefore, each of the data driver blocks DB1 to DB4 outputs data signals for 60 (HPN/DBN=240/4=60) data lines to the display panel in one horizontal scan period. Each of the memory blocks MB1 to MB4 stores image data for "(VPN×HPN×PDB)/MBN=(320×240×18)/4" bits. In FIG. 17B, a column address decoder CD12 is used in common by the memory blocks MB1 and MB2. A column address decoder CD34 is used in common by the memory blocks MB3 and MB4.

5.2 A Plurality of Readings in One Horizontal Scan Period

In FIG. 17B, each of the data driver blocks DB1 to DB4 outputs data signals for 60 data lines in one horizontal scan period. Therefore, image data corresponding to the data signals for 240 data lines must be read from the data driver blocks DB1 to DB4 corresponding to the data driver blocks DB1 to DB4 in one horizontal scan period.

However, when the number of bits of image data read in one horizontal scan period is increased, it is necessary to increase the number of memory cells (sense amplifiers) arranged in the direction D2. As a result, since the width W of the integrated circuit device in the direction D2 is increased, the width of the chip cannot be reduced. Moreover, since the length of the wordline WL is increased, a signal delay problem in the wordline WL occurs.

In the embodiment, the image data stored in the memory blocks MB1 to MB4 is read from the memory blocks MB1 to MB4 into the data driver blocks DB1 to DB4 a plurality of times (RN times) in one horizontal scan period.

Figure 18:
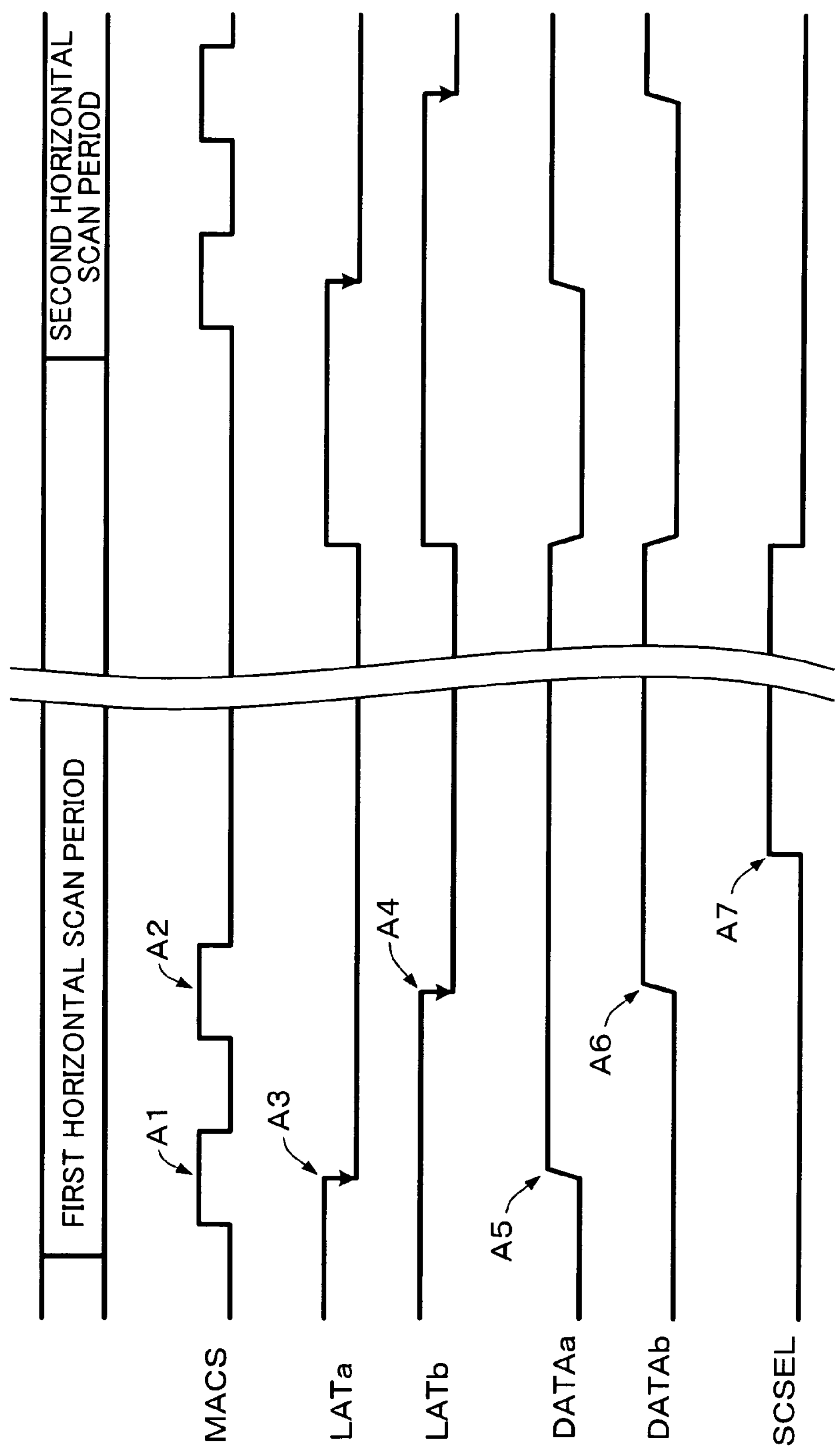
FIG. 18 is illustrative of a method of reading image data a plurality of times in one horizontal scan period.
Figure 19:
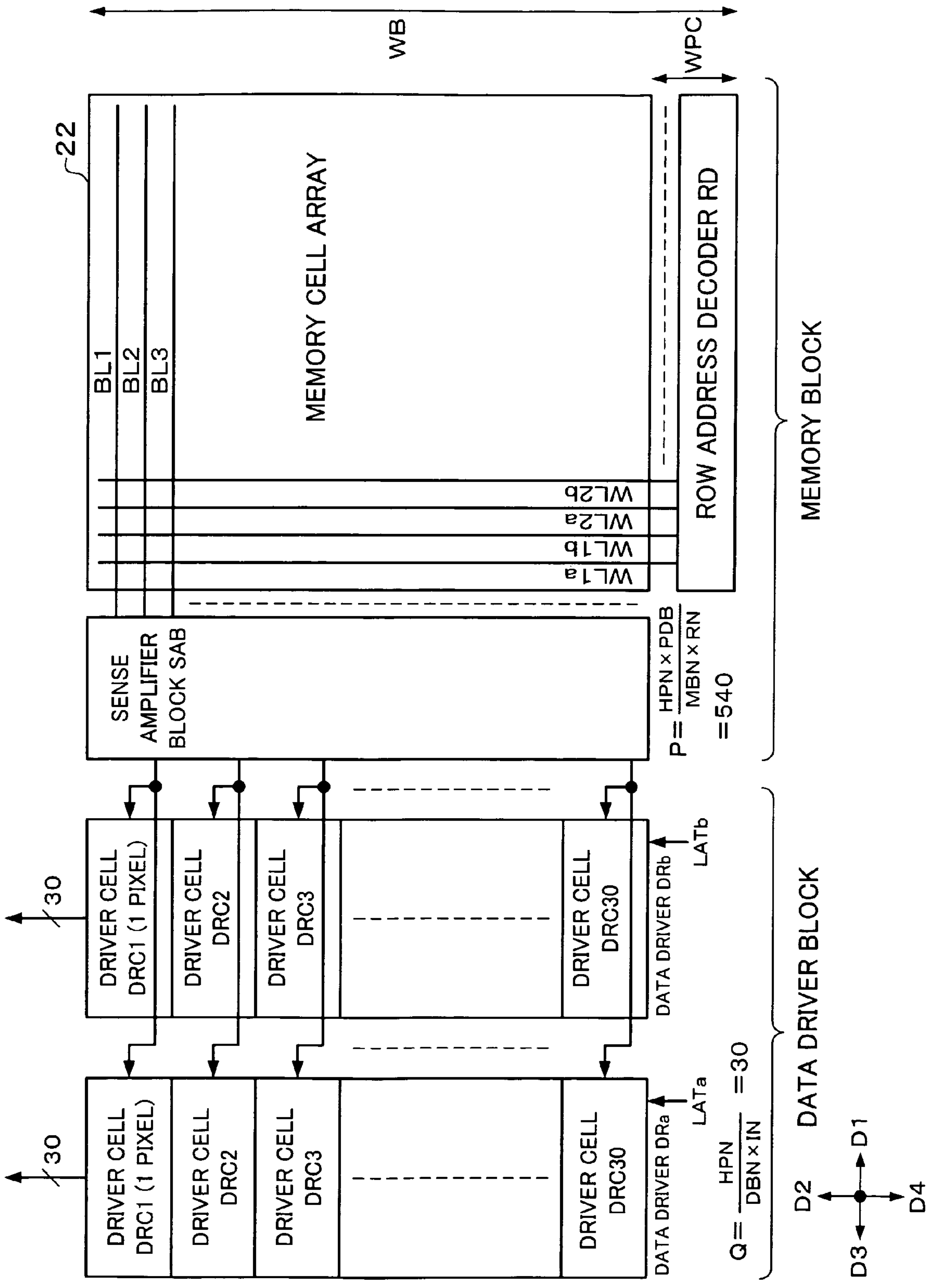
FIG. 19 is an arrangement example of the data driver and a driver cell.

In FIG. 18, a memory access signal MACS (word select signal) goes active (high level) twice (RN=2) in one horizontal scan period as indicated by A1 and A2, for example. This causes the image data to be read from each memory block into each data driver block twice (RN=2) in one horizontal scan period. Then, data latch circuits included in data drivers DRa and DRb shown in FIG. 19 provided in the data driver block latch the read image data based on latch signals LATa and LATb indicated by A3 and A4. D/A conversion circuits included in the data drivers DRa and DRb perform D/A conversion of the latched image data, and output circuits included in the data drivers DRa and DRb output data signals DATAa and DATAb obtained by D/A conversion to the data signal output line as indicated by A5 and A6. A scan signal SCSEL input to the gate of the TFT of each pixel of the display panel goes active as indicated by A7, and the data signal is input to and held by each pixel of the display panel.

In FIG. 18, the image data is read twice in the first horizontal scan period, and the data signals DATAa and DATAb are output to the data signal output line in the first horizontal scan period. However, the image data may be read twice and latched in the first horizontal scan period, and the data signals DATAa and DATAb corresponding to the latched image data may be output to the data signal output line in the second horizontal scan period. FIG. 18 shows the case where the number of readings RN is 2. However, the number of readings RN may be three or more (RN≧3).

According to the method shown in FIG. 18, the image data corresponding to the data signals for 30 data lines is read from each memory block, and each of the data drivers DRa and DRb outputs the data signals for 30 data lines, as shown in FIG. 19. Therefore, the data signals for 60 data lines are output from each data driver block. As described above, it suffices to read the image data corresponding to the data signals for 30 data lines from each memory block in one read operation in FIG. 18. Therefore, the number of memory cells and sense amplifiers in the direction D2 in FIG. 19 can be reduced in comparison with the method of reading the image data only once in one horizontal scan period. As a result, since the width W of the integrated circuit device in the direction D2 can be reduced, a very slim chip as shown in FIG. 2B can be realized. The length of one horizontal scan period is about 52 microseconds in the case of a QVGA display. On the other hand, the memory read time is about 40 nsec, for example, which is sufficiently shorter than 52 microseconds. Therefore, even if the number of readings in one horizontal scan period is increased from once to several times, the display characteristics are not affected to a large extent.

FIG. 17A shows an example of a QVGA (320×240) display panel. However, it is possible to deal with a VGA (640×480) display panel by increasing the number of readings RN in one horizontal scan period to four (RN=4), for example, whereby the degrees of freedom of the design can be increased.

A plurality of readings in one horizontal scan period may be realized by a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of readings in one horizontal scan period may be realized by combining the first method and the second method.

5.3 Arrangement of Data Driver and Driver Cell

FIG. 19 shows an arrangement example of data drivers and driver cells included in the data drivers. As shown in FIG. 19, the data driver block includes a plurality of data drivers DRa and DRb disposed along the direction D1. Each of the data drivers DRa and DRb includes 30 (Q in a broad sense) driver cells DRC1 to DRC30.

When a wordline WL1*a* of the memory block is selected and the first image data is read from the memory block as indicated by A1 shown in FIG. 18, the data driver DRa latches the read image data based on the latch signal LATa indicated by A3. The data driver DRa performs D/A conversion of the latched image data, and outputs the data signal DATAa corresponding to the first read image data to the data signal output line as indicated by A5.

When a wordline WL1*b* of the memory block is selected and the second image data is read from the memory block as indicated by A2 shown in FIG. 18, the data driver DRb latches the read image data based on the latch signal LATb indicated by A4. The data driver DRb performs D/A conversion of the latched image data, and outputs the data signal DATAb corresponding to the second read image data to the data signal output line as indicated by A6.

As described above, each of the data drivers DRa and DRb outputs the data signals for 30 data lines corresponding to 30 pixels so that the data signals for 60 data lines corresponding to 60 pixels are output in total.

As described above, the number Q of driver cells DRC1 to DRC30 disposed along the direction D2 may be expressed as "Q=HPN/(DBN×IN)". In FIG. 19, since HPN=240, DBN=4, and IN=2, Q=240/(4×2)=30. As described above, the number P of sense amplifiers disposed in the sense amplifier block SAB along the direction D2 may be expressed as "P=(HPN×PDB)/(MBN×RN)". In FIG. 19, since HPN=240, PDB=18, MBN=4, and RN=2, P=(240×18)/(4×2)=540.

5.4 Memory Cell

Figure 20A:
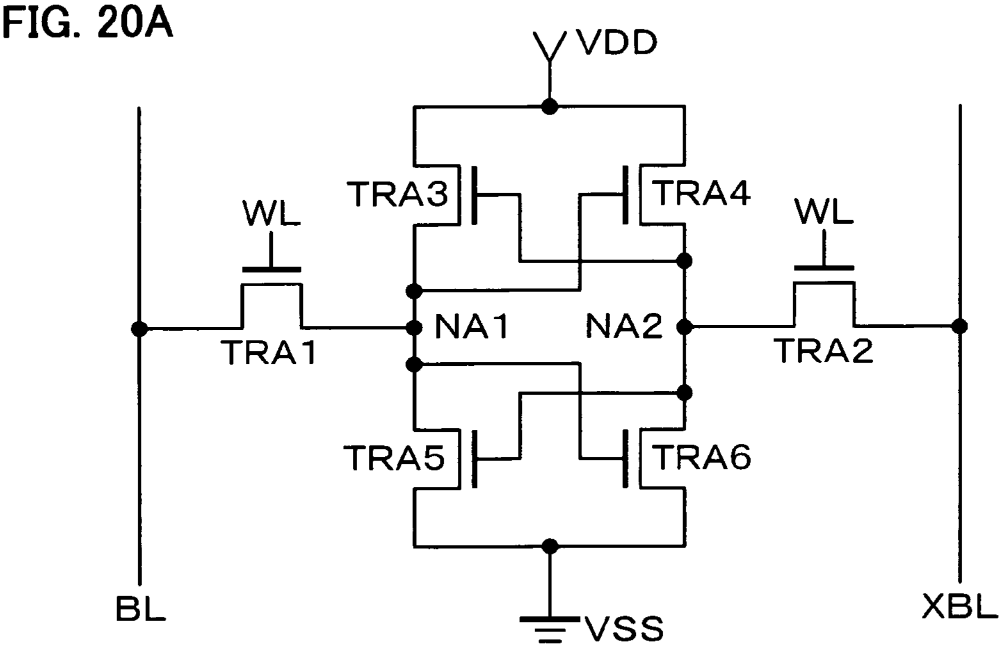
FIGS. 20A to 20C are configuration examples of a memory cell.

FIG. 20A shows a configuration example of the memory cell (SRAM) included in the memory block. The memory cell includes transfer transistors TRA1 and TRA2, load transistors TRA3 and TRA4, and driver transistors TRA5 and TRA6. The transfer transistors TRA1 and TRA2 are turned ON when the wordline WL goes active, so that image data can be written into nodes NA1 and NA2 or read from the nodes NA1 and NA2. The image data written into the memory cell is held at the nodes NA1 and NA2 by using flip-flop circuits formed by the transistors TRA3 to TRA6. The configuration of the memory cell of the embodiment is not limited to the configuration shown in FIG. 20A. Various modifications and variations may be made, such as using resistor elements as the load transistors TRA3 and TRA4 or adding other transistors.

Figure 20B:
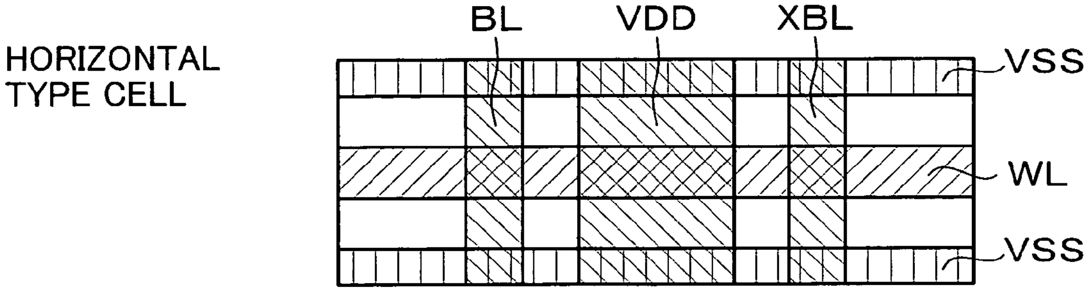
Figure 20C:
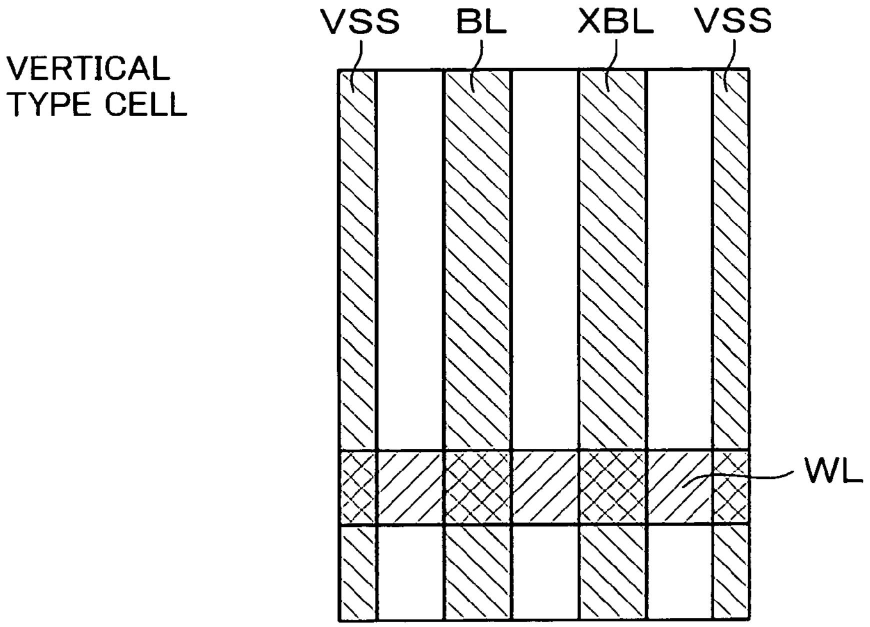

FIGS. 20B and 20C show layout examples of the memory cell. FIG. 20B shows a layout example of a horizontal type cell, and FIG. 20C shows a layout example of a vertical type cell. As shown in FIG. 20B, the horizontal type cell is a cell in which the wordline WL is longer than the bitlines BL and XBL in each memory cell. As shown in FIG. 20C, the vertical type cell is a cell in which the bitlines BL and XBL are longer than the wordline WL in each memory cell. The wordline WL shown in FIG. 20C is a local wordline which is formed by a polysilicon layer and connected with the transfer transistors TRA1 and TRA2. However, a wordline formed by a metal layer may be further provided to prevent a signal delay in the wordline WL and to stabilize the potential of the wordline WL.

Figure 21:
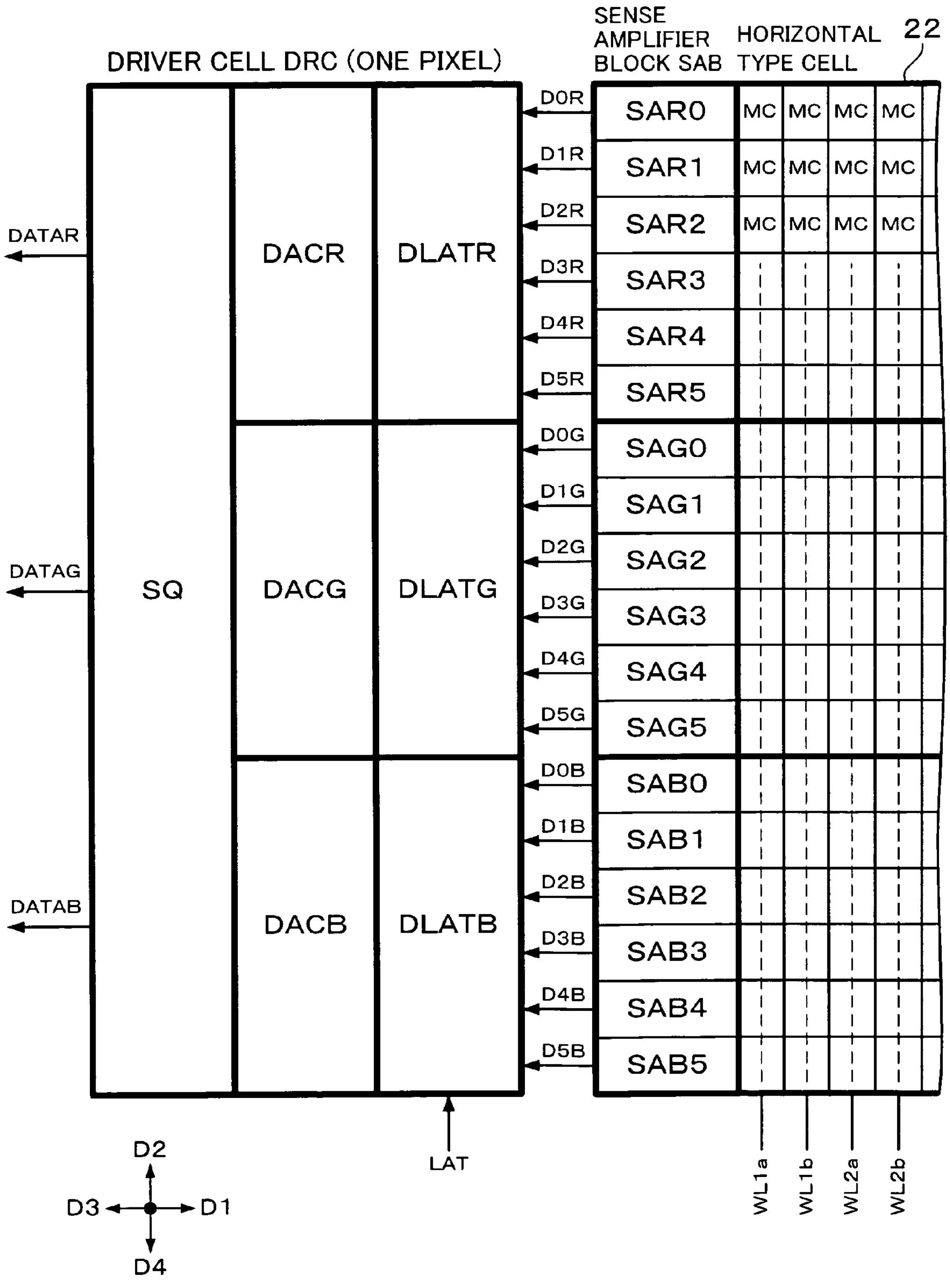
FIG. 21 is an arrangement example of the memory block and the driver cell when using a horizontal type cell.

FIG. 21 shows an arrangement example of the memory block and the driver cell when using the horizontal type cell shown in FIG. 20B as the memory cell. FIG. 21 shows a section of the driver cell and the memory block corresponding to one pixel in detail.

As shown in FIG. 21, the driver cell DRC which receives image data for one pixel includes R, G and B data latch circuits DLATR, DLATG, and DLATB. Each of the data latch circuits DLATR, DLATG, and DLATB latches image data when the latch signal LAT (LATa, LATb) goes active. The driver cell DRC includes the R, G, and B digital-analog converters DACR, DACG, and DACB described with reference to FIG. 10A. The driver cell DRC also includes the output section SQ described with reference to FIGS. 10B and 10C.

A section of the sense amplifier block SAB corresponding to one pixel includes R sense amplifiers SAR0 to SAR5, G sense amplifiers SAG0 to SAG5, and B sense amplifiers SAB0 to SAB5. The bitlines BL and XBL of the memory cells MC arranged along the direction D1 on the D1 side of the sense amplifier SAR0 are connected with the sense amplifier SAR0. The bitlines BL and XBL of the memory cells MC arranged along the direction D1 on the D1 side of the sense amplifier SAR1 are connected with the sense amplifier SAR1.

The above description also applies to the relationship between the remaining sense amplifiers and the memory cells.

When the wordline WL1*a* is selected, image data is read from the memory cells MC of which the gate of the transfer transistor is connected with the wordline WL1*a* through the bitlines BL and XBL, and the sense amplifiers SAR0 to SAR5, SAG0 to SAG5, and SAB0 to SAB5 perform the signal amplification operation. The data latch circuit DLATR latches 6-bit R image data D0R to D5R from the sense amplifiers SAR0 to SAR5, the digital-analog converter DACR performs D/A conversion of the latched image data, and the output section SQ outputs the data signal DATAR. The data latch circuit DLATG latches 6-bit G image data DOG to D5G from the sense amplifiers SAG0 to SAG5, the digital-analog converter DACG performs D/A conversion of the latched image data, and the output section SQ outputs the data signal DATAG. The data latch circuit DLATB latches 6-bit G image data D0B to D5B from the sense amplifiers SAB0 to SAB5, the digital-analog converter DACB performs D/A conversion of the latched image data, and the output section SQ outputs the data signal DATAB.

In the configuration shown in FIG. 21, the image data can be read a plurality of times in one horizontal scan period shown in FIG. 18 as described below. Specifically, in the first horizontal scan period (first scan line select period), the first image data is read by selecting the wordline WL1*a*, and the first data signal DATAa is output as indicated by A5 shown in FIG. 18. In the first horizontal scan period, the second image data is read by selecting the wordline WL1*b*, and the second data signal DATAb is output as indicated by A6 shown in FIG. 18. In the second horizontal scan period (second scan line select period), the first image data is read by selecting the wordline WL2*a*, and the first data signal DATAa is output. In the second horizontal scan period, the second image data is read by selecting the wordline WL2*b*, and the second data signal DATAb is output. When using the horizontal type cell, the image data can be read a plurality of times in one horizontal scan period by selecting different wordlines (WL1*a* and WL1*b*) in the memory block in one horizontal scan period.

Figure 22:
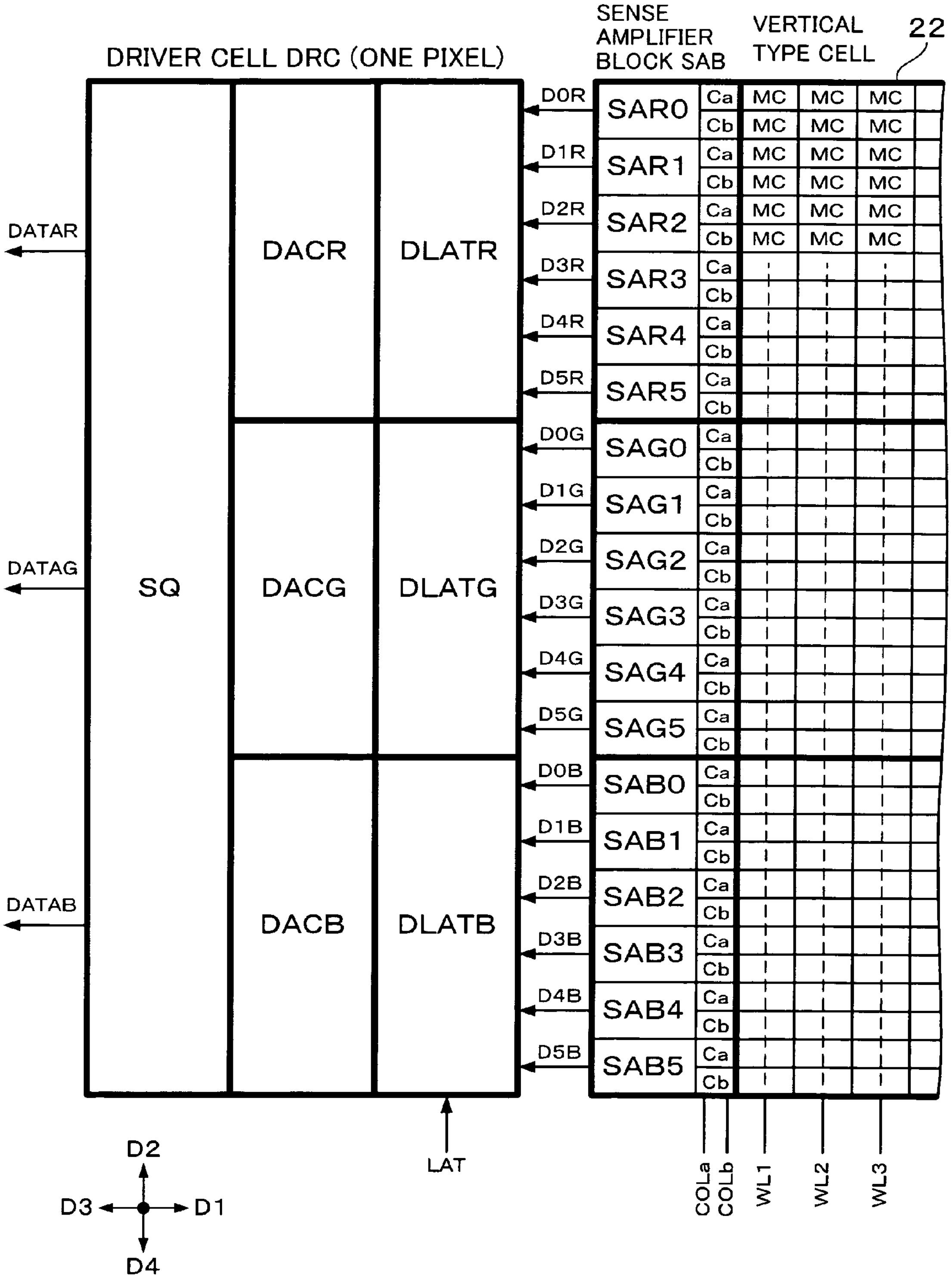
FIG. 22 is an arrangement example of the memory block and the driver cell when using a vertical type cell.

FIG. 22 shows an arrangement example of the memory block and the driver cell when using the vertical type cell shown in FIG. 20C as the memory cell. The width of the vertical type cell in the direction D2 can be reduced in comparison with the horizontal type cell. Therefore, the number of memory cells in the direction D2 can be doubled in comparison with the horizontal type cell. When using the vertical type cell, the column of the memory cells connected with each sense amplifier is switched by using column select signals COLa and COLb.

In FIG. 22, when the column select signal COLa goes active, the column Ca side memory cells MC provided on the D1 side of the sense amplifiers SAR0 to SAR5 are selected and connected with the sense amplifiers SAR0 to SAR5, for example. The signals of the image data stored in the selected memory cells MC are amplified and output as the image data D0R to D5R. When the column select signal COLb goes active, the column Cb side memory cells MC provided on the D1 side of the sense amplifiers SAR0 to SAR5 are selected and connected with the sense amplifiers SAR0 to SAR5. The signals of the image data stored in the selected memory cells MC are amplified and output as the image data D0R to D5R. The above description also applies to the read operation of image data from the memory cells connected with the remaining sense amplifiers.

In the configuration shown in FIG. 22, the image data can be read a plurality of times in one horizontal scan period shown in FIG. 18 as described below. Specifically, in the first horizontal scan period, the first image data is read by selecting the wordline WL1 and setting the column select signal COLa to active, and the first data signal DATAa is output as indicated by A5 shown in FIG. 18. In the first horizontal scan period, the second image data is read by again selecting the wordline WL1 and setting the column select signal COLb to active, and the second data signal DATAb is output as indicated by A6 shown in FIG. 18. In the second horizontal scan period, the first image data is read by selecting the wordline WL2 and setting the column select signal COLa to active, and the first data signal DATAa is output. In the second horizontal scan period, the second image data is read by again selecting the wordline WL2 and setting the column select signal COLb to active, and the second data signal DATAb is output. When using the vertical type cell, the image data can be read a plurality of times in one horizontal scan period by selecting a single wordline in the memory block a plurality of times in one horizontal scan period.

6. Electronic Instrument

Figure 23A:
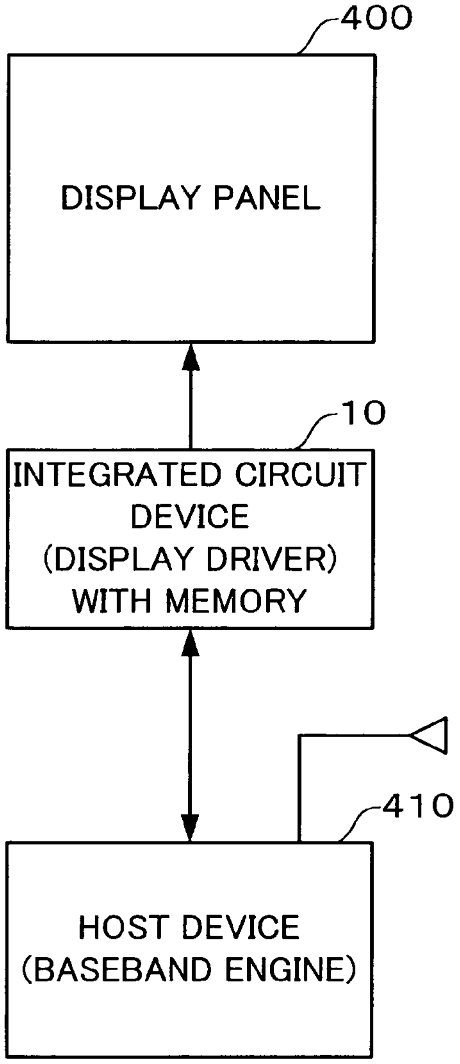
FIGS. 23A and 23B are configuration examples of an electronic instrument according to one embodiment of the invention.
Figure 23B:
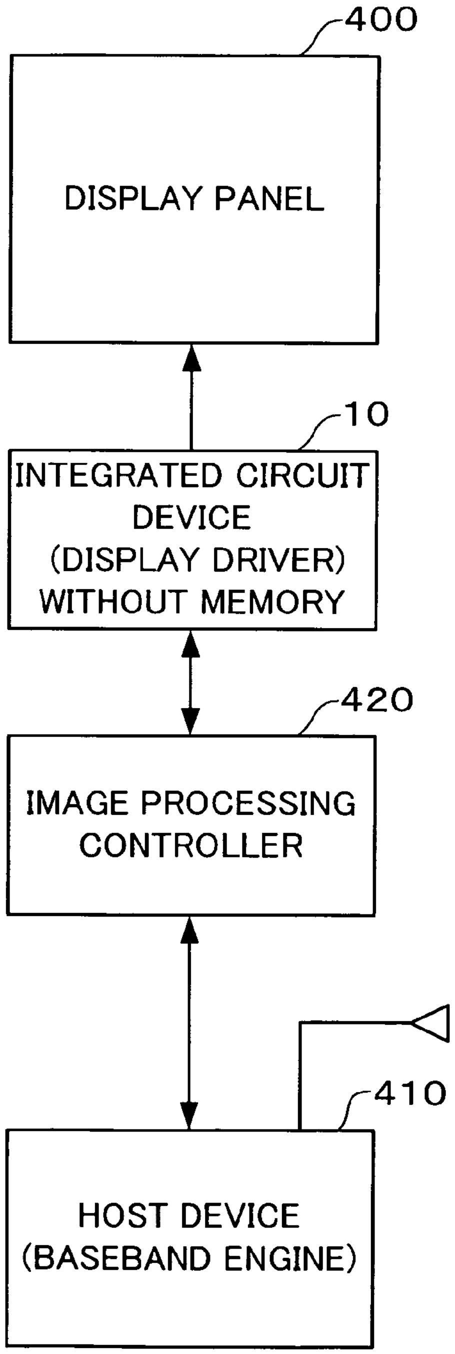

FIGS. 23A and 23B show examples of an electronic instrument (electro-optical device) including the integrated circuit device 10 of the embodiment. The electronic instrument may include constituent elements (e.g. camera, operation section, or power supply) other than the constituent elements shown in FIGS. 23A and 23B. The electronic instrument of the embodiment is not limited to a portable telephone, and may be a digital camera, PDA, electronic notebook, electronic dictionary, projector, rear-projection television, portable information terminal, or the like.

In FIGS. 23A and 23B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 23B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 23A, the integrated circuit device 10 may include a memory. In this case, the integrated circuit device 10 writes image data from the host device 410 into the built-in memory, and reads the written image data from the built-in memory to drive the display panel. In FIG. 23B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term (such as the output-side I/F region and the input-side I/F region) cited with a different term having broader or the same meaning (such as the first interface region and the second interface region) at least once in this specification or drawings can be replaced by the different term in any place in this specification and drawings. The configuration, arrangement, and operation of the integrated circuit device and the electronic instrument are not limited to those described in the embodiment. Various modifications and variations may be made.

What is claimed is:

1. An integrated circuit device, comprising:

first to Nth circuit blocks (N is an integer larger than one) disposed along a first direction, when the first direction is a direction from a first side of the integrated circuit device toward a third side that is opposite to the first side, the first side being a short side, and when a second direction is a direction from a second side of the integrated circuit device toward a fourth side that is opposite to the second side, the second side being a long side;

a first interface region provided along the fourth side and on the second direction side of the first to Nth circuit blocks; and a second interface region provided along the second side and on a fourth direction side of the first to Nth circuit blocks, the fourth direction side being opposite to the second direction, the first to Nth circuit blocks including at least one data driver block that drives data lines and a circuit block other than the at least one data driver block, and when widths of the first interface region, the first to Nth circuit blocks, and the second interface region are respectively W1, WB, and W2, the integrated circuit device has a width W of "W1+WB+W2≦W<W1+2×WB+W2", the widths W1, WB, W2 and W being lengths along the second direction.

2. The integrated circuit device as defined in claim 1, the first interface region being disposed on the second direction side of the at least one data driver block without another circuit block interposed therebetween, and the second interface region being disposed on the fourth direction side of the at least one data driver block without another circuit block interposed therebetween.

3. The integrated circuit device as defined in claim 1, data signal output lines of the at least one data driver block being disposed in the at least one data driver block along the second direction.

4. The integrated circuit device as defined in claim 3, the data signal output lines of the at least one data driver block being disposed in the first interface region along the first direction.

5. The integrated circuit device as defined in claim 1, a data driver included in the at least one data driver block includes Q driver cells arranged along the second direction, each of the driver cells outputting a data signal corresponding to image data for one pixel, and when a width of the driver cell is WD, the first to Nth circuit blocks have a width WB of "Q×WD≦WB<(Q+1)×WD", the widths WD and WB being lengths along the second direction.

6. The integrated circuit device as defined in claim 5, when the number of pixels in a horizontal scan direction is HPN, the number of the at least one data driver blocks is DBN, and the number of inputs of image data to the driver cell in one horizontal scan period is IN, the number Q of the driver cells arranged along the second direction being "Q=HPN/(DBN×IN)".

7. The integrated circuit device as defined in claim 1, the first to Nth circuit blocks including at least one memory block that stores image data.

8. The integrated circuit device as defined in claim 7, the first interface region being disposed on the second direction side of the at least one memory block without another circuit block interposed therebetween, and the second interface region being disposed on the fourth direction side of the at least one memory block without another circuit block interposed therebetween.

9. The integrated circuit device as defined in claim 7, a data driver included in the at least one data driver block including Q driver cells arranged along the second direction, each of the driver cells outputting a data signal corresponding to image data for one pixel, and when a width of the driver cell is WD, and a width of a peripheral circuit section included in the at least one memory block is WPC, "Q×WD≦WB<(Q+1)×WD+WPC" being satisfied, the widths WD and WPC being lengths along the second direction.

10. The integrated circuit device as defined in claim 9, when the number of pixels in a horizontal scan direction is HPN, the number of the at least one data driver blocks is DBN, and the number of inputs of image data to the driver cell in one horizontal scan period is IN, the number Q of the driver cells arranged along the second direction being "Q=HPN/(DBN×IN)".

11. The integrated circuit device as defined in claim 7, a sense amplifier block included in the at least one memory block including P sense amplifiers arranged along the second direction, each of the sense amplifiers outputting 1-bit image data, and when a width of the sense amplifier is WS, the number of bits of image data for one pixel is PDB, and a width of a peripheral circuit section included in the at least one memory block is WPC, "P×WS≦WB<(P+PDB)×WS+WPC" being satisfied, the widths WAS and WPC being lengths along the second direction.

12. The integrated circuit device as defined in claim 11, when the number of pixels in a horizontal scan direction is defined as HPN, the number of bits of image data for one pixel is PDB, the number of the at least one memory block is MBN, and the number of readings of image data from the at least one memory block in one horizontal scan period is RN, the number P of the sense amplifiers arranged along the second direction being "P=(HPN×PDB)/(MBN×RN)".

13. The integrated circuit device as defined in claim 7, the at least one memory block and the at least one data driver block being disposed adjacent to each other along the first direction.

14. The integrated circuit device as defined in claim 7, image data stored in the at least one memory block being read from the at least one memory block into the at least one data driver block adjacent to the at least one memory block a plurality of times in one horizontal scan period.

15. The integrated circuit device as defined in claim 10, image data stored in the at least one memory block being read from the at least one memory block into the at least one data driver block adjacent to the at least one memory block a plurality of times in one horizontal scan period.

16. The integrated circuit device as defined in claim 12, image data stored in the at least one memory block being read from the at least one memory block into the at least one data driver block adjacent to the at least one memory block a plurality of times in one horizontal scan period.

17. The integrated circuit device as defined in claim 1, the width W of the integrated circuit device being "$W<2\times WB$".

18. The integrated circuit device as defined in claim 7, the width W of the integrated circuit device being "$W<2\times WB$".

19. An electronic instrument, comprising:

the integrated circuit device as defined in claim 1; and an electro-optical device driven by the integrated circuit device.

20. An electronic instrument, comprising:

the integrated circuit device as defined in claim 7; and an electro-optical device driven by the integrated circuit device.

* * * * *